(12) United States Patent
Yersin et al.

(10) Patent No.: US 8,766,238 B2
(45) Date of Patent: Jul. 1, 2014

(54) POLYMERIC ANIONS/CATIONS

(75) Inventors: Hartmut Yersin, Sinzing (DE); Uwe Monkowius, Linz (AT); Dominik Pentlehner, Regensburg (DE)

(73) Assignee: Merck Patent GmbH, Darmstadt (DE)

( * ) Notice: Subject to any disclaimer, the term of this patent is extended or adjusted under 35 U.S.C. 154(b) by 181 days.

(21) Appl. No.: 12/523,173

(22) PCT Filed: Jan. 17, 2008

(86) PCT No.: PCT/EP2008/000347
§ 371 (c)(1),
(2), (4) Date: Jul. 15, 2009

(87) PCT Pub. No.: WO2008/087031
PCT Pub. Date: Jul. 24, 2008

(65) Prior Publication Data
US 2010/0059740 A1   Mar. 11, 2010

(30) Foreign Application Priority Data

Jan. 17, 2007   (DE) .................. 10 2007 002 420

(51) Int. Cl.
H01L 51/50   (2006.01)
H01L 51/40   (2006.01)

(52) U.S. Cl.
USPC .............. 257/40; 257/E51.026; 257/E51.018; 438/46

(58) Field of Classification Search
USPC ................ 257/40, E51.026, E51.018; 438/46
See application file for complete search history.

(56) References Cited

U.S. PATENT DOCUMENTS

| | | | | |
|---|---|---|---|---|
| 6,869,693 B2 * | 3/2005 | Fryd et al. | | 428/690 |
| 7,029,766 B2 * | 4/2006 | Huo et al. | | 428/690 |
| 7,098,295 B2 * | 8/2006 | Chen et al. | | 528/412 |
| 7,288,331 B2 * | 10/2007 | Thompson et al. | | 428/690 |
| 7,635,777 B2 * | 12/2009 | Ye et al. | | 548/445 |
| 7,825,249 B2 | 11/2010 | Stossel et al. | | |
| 2002/0179885 A1 | 12/2002 | Che et al. | | |
| 2003/0091862 A1 | 5/2003 | Tokito et al. | | |
| 2003/0148142 A1 | 8/2003 | Fryd et al. | | |
| 2003/0186080 A1 | 10/2003 | Kamatani et al. | | |
| 2003/0205707 A1 | 11/2003 | Chi-Ming | | |
| 2005/0196637 A1 * | 9/2005 | Herron | | 428/690 |

(Continued)

FOREIGN PATENT DOCUMENTS

DE    10224617 A1    12/2003
DE    10311767 A1    9/2004

(Continued)

OTHER PUBLICATIONS

W.Y. Wong, et al. "Efficient Organic Light-Emitting Diodes based on Sublimable Charged Iridium Phosphorescent Emitters", Advanced Functional Materials, 2007, 17, 315-323.*

(Continued)

Primary Examiner — Thao X Le
Assistant Examiner — Sheng Zhu
(74) Attorney, Agent, or Firm — Drinker Biddle & Reath LLP

(57) ABSTRACT

The present invention relates to light-emitting devices and in particular organic light-emitting devices (OLEDs). In particular, the invention relates to emitter materials in which charged metal complexes are bonded to a polymer by electrostatic interactions.

39 Claims, 4 Drawing Sheets

Diagrammatic and simplified representation of the way in which an OLED functions. The applied layers are, for example, only about 300 nm thick.

(56) References Cited

U.S. PATENT DOCUMENTS

| | | |
|---|---|---|
| 2005/0260449 A1 | 11/2005 | Walters et al. |
| 2006/0093852 A1 | 5/2006 | Marsitzky et al. |
| 2006/0258043 A1 | 11/2006 | Bold et al. |
| 2007/0111025 A1 | 5/2007 | Lennartz et al. |
| 2007/0135635 A1 | 6/2007 | Stoessel et al. |
| 2007/0264524 A1 | 11/2007 | Gessner et al. |

FOREIGN PATENT DOCUMENTS

| | | | |
|---|---|---|---|
| DE | 10338550 A1 | 3/2005 | |
| DE | 10350606 A1 | 6/2005 | |
| DE | 10358665 A1 | 7/2005 | |
| EP | 1672048 A1 | 6/2006 | |
| JP | 2000204364 A | 7/2000 | |
| JP | 2003313546 * | 4/2002 | ............ C09K 11/06 |
| JP | 2003342325 A | 12/2003 | |
| JP | 2004531850 A | 10/2004 | |
| JP | 2005528508 A | 9/2005 | |
| JP | 2007106793 A | 4/2007 | |
| JP | 2007165606 A | 6/2007 | |
| WO | WO-03/095587 A1 | 11/2003 | |
| WO | WO-2004/016711 A1 | 2/2004 | |
| WO | WO-2004/017042 A2 | 2/2004 | |
| WO | WO-2005/098988 A1 | 10/2005 | |
| WO | WO-2005113563 A1 | 12/2005 | |
| WO | WO-2007/118671 A1 | 10/2007 | |

OTHER PUBLICATIONS

Zhao, et al. "Organic Light-Emitting Diode Using Eu3+ Polymer Complex as an Emitter". Japanese Journal of Applied Physics, vol. 38, 1999 Pt. 2, No. 1A/B, pp. 46-48.

Yang et al., "Monochromatic-Red-Light Emission of Novel Copolymers Containing Carbazole Units and Europium-Acrylate Complexes", Journal of Polymer Science, pp. 3405-3411, 2000.

Japanese Examination Report from corresponding Japanese Application No. 2009-545873, dated Feb. 7, 2013.

\* cited by examiner

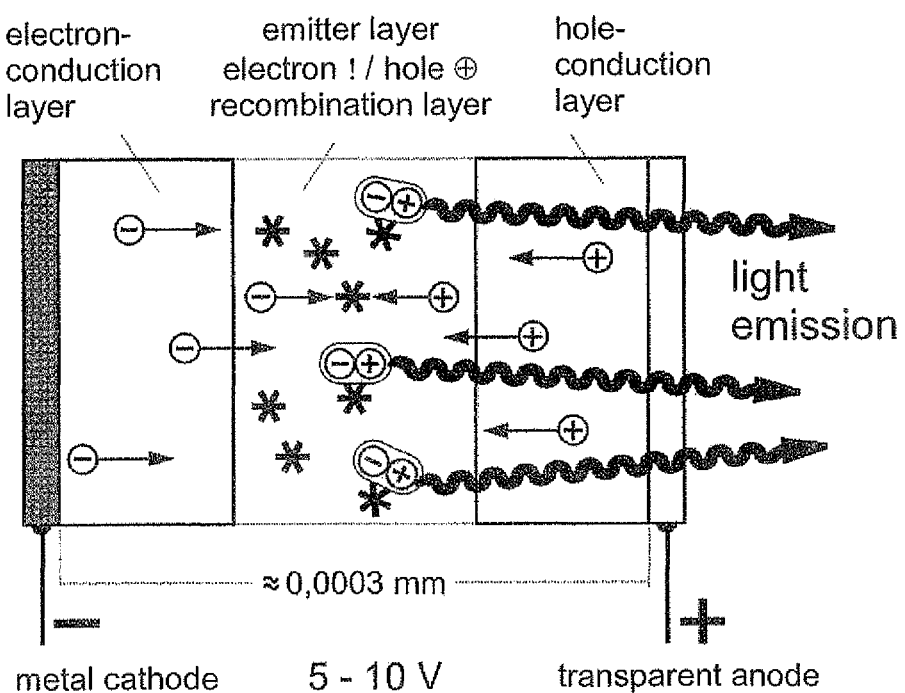
Fig. 1: Diagrammatic and simplified representation of the way in which an OLED functions. The applied layers are, for example, only about 300 nm thick.

| 7 | Cathode, Al: 60 nm |
|---|---|
| 6 | Interlayer CsF: 0.8 nm |
| 5 | ETL, Alq$_3$: 40 nm |
| 4 | Emitter layer: 30 to 100 nm |
| 3 | HTL, PEDOT: PSS: 50 nm |
| 2 | Anode, ITO: 40 nm |
| 1 | Support material: glass |

Fig. 2: Example of an OLED device for the emitter layer according to the invention. The layer thickness data are illustrative values.

POLYMERIC ANIONS/CATIONS

CROSS-REFERENCE TO RELATED APPLICATIONS

This application is a national stage application (under 35 U.S.C. §371) of PCT/EP2008/000347, filed Jan. 17, 2008, which claims benefit of German application 10 2007 002420.9, filed Jan. 17, 2007.

BACKGROUND OF THE INVENTION

The present invention relates to light-emitting devices and in particular organic light-emitting devices (OLEDs). In particular, the invention relates to emitter materials in which charged metal complexes are bonded to a polymer by electrostatic interactions.

In recent years, a novel technology based on the use of electroluminescent materials in so-called OLEDs (organic light-emitting diodes) has been developed in the area of display and lighting technology. The first OLEDs were developed in 1987 (Tang, C. W. et al., Appl. Phys. Let. 51, 913 (1987)). The way in which OLEDs function is based on a multilayered structure which comprises an emitter layer, a hole-conduction layer and an electron-conductor layer. The layers consist predominantly of organic substrates, which can be made very thin and flexible. OLED devices can be manufactured with large surface areas as lighting elements or display screens, but also in the form of smaller displays.

In the production of OLEDs, the various organic layers are applied to a support material. To this end, two different techniques are essentially employed. In vacuum evaporation, molecules are vapour-deposited in vacuo. In a wet-chemical process, the layers are applied from a solution, for example by spin coating, ink-jet printing, doctor blading or screen-printing processes.

The way in which OLEDs function has been described in detail, for example, in H. Yersin, Top. Curr. Chem. 2004, 241. An overview of the function of OLEDs is also given in C. Adachi et al., Appl. Phys. Lett. 2001, 78, 1622; X. H. Yang et al., Appl. Phys. Lett., 2004, 84, 2476; J. Shinar, "Organic light-emitting devices—A survey", AIP-Press, Springer, New York, 2004; W. Sotoyama et al., Appl. Phys. Lett. 2005, 86, 153505; S. Okada et al., Dalton Trans. 2005, 1583 and in Y.-L. Tung et al., Y. Mater. Chem. 2005, 15, 460-464. An up-to-date review of the state of the art is given, for example, in "Highly Efficient OLEDs with Phosphorescent Materials", ed. H. Yersin, Wiley-VCH, Weinheim, Germany 2007.

Since the first reports of OLEDs, these devices and the materials used therein have been intensively developed further. In particular, the emitter materials employed are currently the subject of intensive research.

In particular, so-called triplet or phosphorescent emitters have recently become the focus of research. It has been found that a significantly greater electroluminescence quantum yield can be achieved with phosphorescent emitters than with so-called singlet emitters. Whereas only a transition from the excited singlet state into the singlet ground state results in emission of light in the case of singlet emitters (purely organic compounds), higher electroluminescence quantum yields are possible in the case of organometallic complexes since here light is emitted on transfer from the excited triplet state. Triplet emitters are described, for example, in WO 2004/017042 A2 (Thompson), WO 2004/016711 A1 (Thompson), WO 03/095587 (Tsuboyama), US 2003/0205707 (Chi-Ming Che), US 2002/0179885 (Chi-Ming Che), US 2003/186080 A1 (J. Kamatani), DE 103 50 606 A1 (Stößel), DE 103 38 550 (Bold), DE 103 58 665 A1 (Lennartz), WO 2007/118671 (Yersin). Higher electroluminescence quantum yields are also achieved using phosphorescent lanthanoid complexes.

However, the known emitter materials have various disadvantages. For example, the low thermal stability and the chemical stability to water and oxygen are problematical. In addition, many emitter materials have an excessively short lifetime for use in high-quality electronic applications. There is also a further need for improvement with respect to good synthetic accessibility and manufacturing reproducibility.

A very large number of charged emitter molecules is known which have extraordinarily high emission quantum yields and in which many of the above-mentioned disadvantages do not occur. However, the bonding of charged emitters into an emitter layer of an OLED device causes problems. Owing to their lack of volatility, charged metal complexes cannot be applied by vacuum evaporation. In the case of wet-chemical application, crystallisation/salt formation causes problems. Migration of the ions in the electric field results in different potential ratios in the OLED device.

Starting from the outlined problems of the prior art and the highly promising potential of charged emitters, the object of the present invention was to make charged emitters and in particular charged phosphorescent or triplet emitter metal complexes usable for use in OLED devices.

To this end, it is necessary to restrict the mobility of the charged emitters. Immobilisation of the emitters can be achieved by bonding to a polymer. The strategy of bonding complexes covalently to polymers is described, for example, in P. K. Ng et al., Chem. Eur. J. 2001, 7, 4358; X. Chen et al., J. Am. Chem. Soc. 2003, 125, 636 and in J. Hjelm et al., Inorg. Chem. 2005, 44, 1073. However, the synthetic accessibility of phosphorescent polymers with covalently bonded triplet emitters has hitherto only been possible by very complex methods. The materials can only be obtained in multistep synthetic processes and frequently in unsatisfactory yields.

BRIEF DESCRIPTION OF THE FIGURES

FIG. 1: illustrates a diagrammatic and simplified representation of the way in which an OLED functions. The applied layers are for example, only about 300 nm thick.

FIG. 2: illustrates an example of an OLED device for the emitter layer according to the invention. The layer thickness data are illustrative values.

BRIEF SUMMARY OF THE INVENTION

Figure 3:
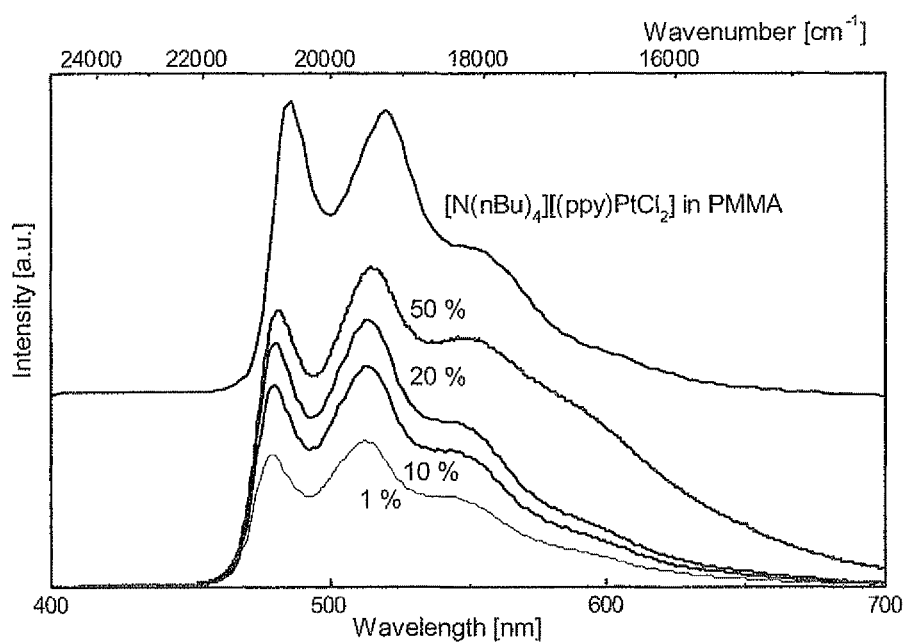
FIG. 3: Emission spectra of the polymer films $[PAA]_{n+m} Cl_n[(ppy)PtCl_2]_m$ from Example 2 at different degrees of coverage at room temperature

The invention relates to a light-emitting device comprising
(i) an anode,
(ii) a cathode and
(iii) an emitter layer which is arranged between and in direct or indirect contact with the anode and the cathode and which comprises at least one charged emitter and an oppositely charged polymeric matrix, which interact with one another through electrostatic forces.

Surprisingly, it has now been found that it is possible to immobilise charged emitters by bonding them to oppositely charged polymers by means of electrostatic interactions.

DETAILED DESCRIPTION OF THE INVENTION

The present invention relates to a light-emitting device comprising
(i) an anode,
(ii) a cathode and
(iii) an emitter layer
which is arranged between and in direct or indirect contact with the anode and the cathode and which comprises at least one charged emitter and an oppositely charged polymeric matrix, which interact with one another through electrostatic forces.

The combination of a charged emitter with an oppositely charged matrix enables the charged emitter to be immobilised and its mobility in an electric field to be restricted.

The charged emitter is preferably a metal complex, which is preferably a phosphorescent emitter or a triplet emitter. In accordance with the present invention, the emitter layer comprises one or more identical or different charged emitters, which are bonded to an oppositely charged polymeric matrix by electrostatic interaction. The term "emitter" or "emitter-metal complex" encompasses both individual compounds and also a multiplicity of compounds, as well as charged, emitting clusters or metal-complex aggregates and should not be understood in a restrictive manner to mean that only a single type of emitter-metal complexes is present in the emitter layer.

According to a first embodiment, the emitter comprises an anionic metal complex, and the matrix comprises a cationic polymer. In accordance with a second embodiment, the emitter comprises a cationic metal complex and the matrix comprises an anionic polymer.

The emitter layer may comprise one or more types of charged emitters and one or more charged polymeric matrix materials. In one embodiment, the emitter layer comprises at least two or more different charged emitters. The emitters here may have identical or different charges. The emitters may be bonded to the same polymeric matrix or to different polymeric matrix materials or different units of the same polymeric matrix. For example, the emitter layer can comprise both anionic emitters which are bonded to a cationic polymer and also cationic emitters which are bonded to an anionic polymer.

Cationic metal complexes which are suitable as emitters for use in the present invention have, for example, the formula (I):

$$[(L_{CH})_x ML_y]^{n+} \quad (I)$$

in which:
M is a metal ion, which is preferably selected from Mo, Ru, Rh, Pd, Ag, W, Re, Os, Ir, Pt, Cu and Au;
  M may also be selected from the group of the lanthanoids;
$L_{CH}$ is in each case independently a chelate ligand, for example a bidentate or polydentate ligand;
L is in each case independently a monodentate ligand;
x is an integer from 1 to 3, in particular 1 or 2;
y is an integer from 0 to 6, in particular from 1 to 4, for example 2;
n is an integer from 1 to 4, in particular 1 or 2.

Examples of chelate ligands $L_{CH}$ are $C^\frown E$ and $E^\frown E$, $E^\frown E^\frown E$ and $E^\frown C^\frown E$, in which:

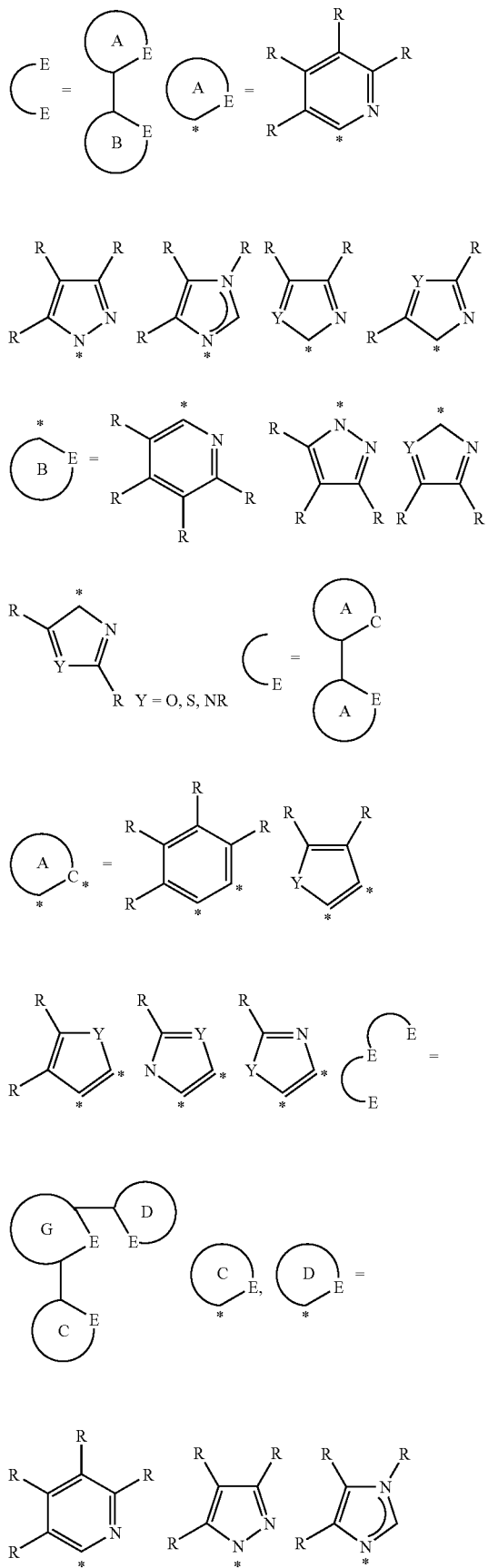

-continued

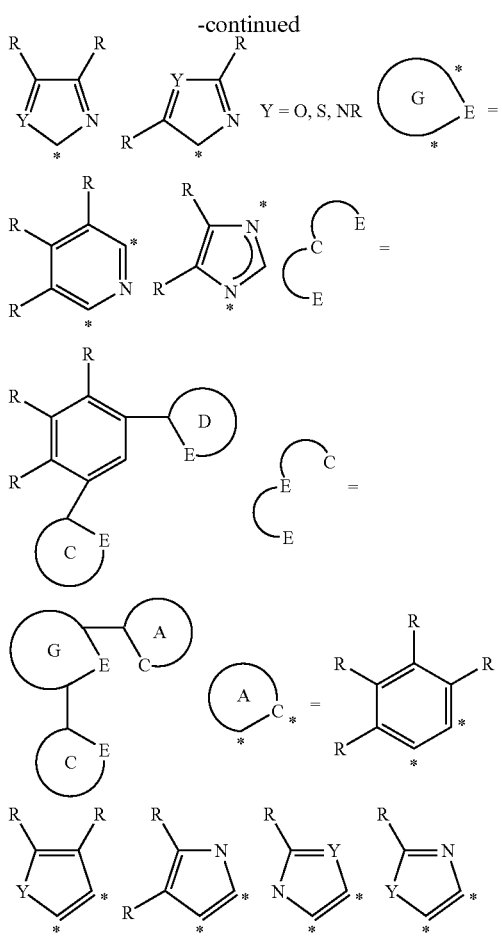

E is selected from elements from the fifth main group, such as N, P, or a carbene carbon $C_{carbene}$.

R in the above formulae for the chelate ligand $L_{CH}$ may in each case independently have the meaning hydrogen, halogen, in particular chloride or bromide, pseudohalogen, in particular thiocyanate, cyanate or cyanide, alkyl, aryl, heteroaryl, alkenyl.

L is preferably a neutral, monodentate ligand which is selected from the group comprising carbon monoxide (CO), amines ($NR_3$), imines (RN=CR), pyridines, phosphines ($PR_3$), arsines ($AsR3$), nitriles (RCN), isonitriles (RNC), ethers (ROR), disulfides (RSR) and diselenides (RSeR). Preference is given to ligands of high field strength, such as, for example, phosphines.

L may also be an anionic ligand, for example from the group of the halides ($F^-$, $C^-$, $Br^-$, $I^-$), pseudohalides ($CN^-$, $OCN^-$, $SCN^-$), alkylic anions (for example $CH_3^-$), arylic anions (for example $Ph^-$), alcoholates ($RO^-$), thiolates ($RS^-$), hydroxide ($OH^-$).

Two monodentate ligands L may also be bridged to give a bidentate chelate ligand $L^\frown L$. The advantage of the use of bidentate ligands over monodentate ligands lies in the higher stability of the resultant complexes. Examples of bidentate chelate ligands $L^\frown L$ are:
2,2'-bipyridine, phenanthroline, diamines, diphosphines, diarsines, such as, for example, $R_2E$-L'-$ER_2$, in which E is an element from the fifth main group, for example N, P or As, and in which L' is a linker, for example a bridging alkyl, aryl or aralkyl group, which may optionally be substituted, or in which the linker L' is —$(CH_2)_m$—NR—$(CH_2)_m$— and m is an integer from 0 to 4 and R is as defined below. Preferred bidentate ligands $L^\frown L$ are

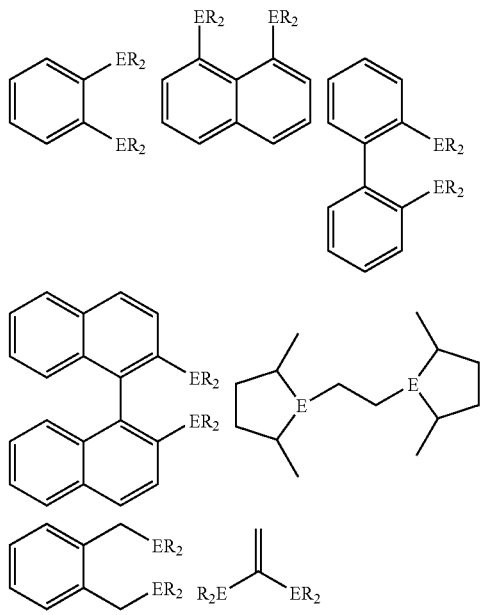

R is in each case, independently of one another, hydrogen, halogen, in particular chloride or bromide, pseudohalogen, in particular thiocyanate, cyanate or cyanide, alkyl, aryl, heteroaryl, alkenyl, each of which may be bonded directly or via oxygen (—OR), nitrogen (—$NR_2$) or silicon (—$SiR_3$) and which may optionally be substituted by substituents, such as halogens, lower alkyl groups and other donor and acceptor groups. Two or more groups R may also be connected to one another, for example with formation of fused ring systems.

Examples of preferred cationic metal complexes of the formula (I) are:

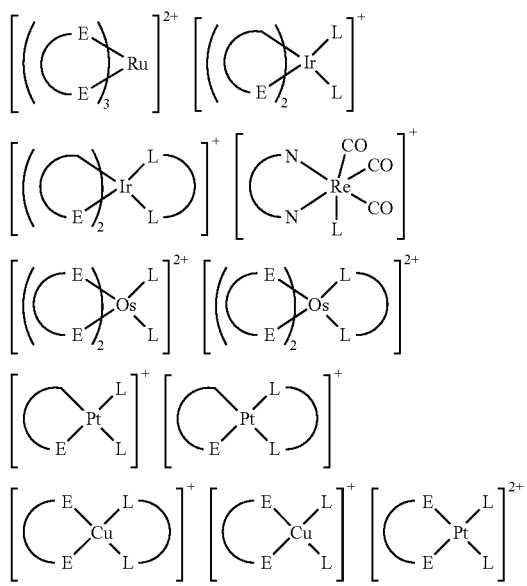

-continued

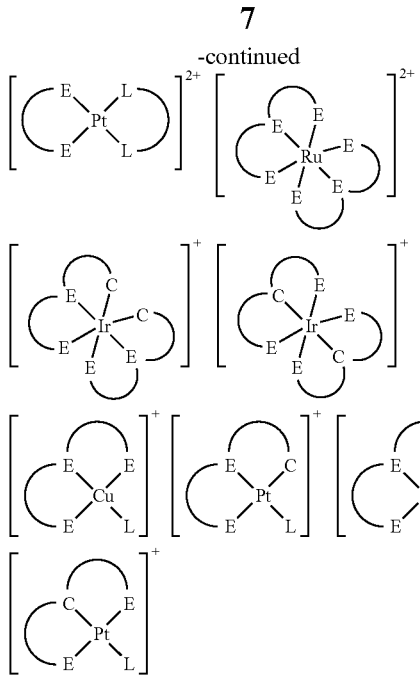

Preferred cationic emitters are also metal complexes which contain a cryptand ligand, for example

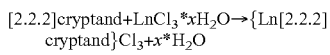

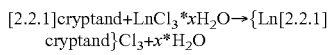

Ln=lanthanoids

A preferred example is the blue-emitting {Ce[2.2.2]cryptand}3+

Anionic metal complexes which are suitable as emitters for use in the present invention have, for example, the formula (II):

$$[(L_{CH})_xML_y]^{n-} \quad (II)$$

in which:

M is a metal ion, which is preferably selected from Mo, Ru, Rh, Pd,
Ag, W, Re, Os, Ir, Pt, Cu and Au;
M may also be selected from the group of the lanthanoids;
$L_{CH}$ is in each case independently a chelate ligand, for example a bidentate ligand;
L is in each case independently a monodentate ligand;
x is an integer from 1 to 3, in particular 1 or 2;
y is an integer from 0 to 6, in particular from 1 to 4, for example 2;
n is an integer from 1 to 4, in particular 1 or 2.

L is preferably a neutral, monodentate ligand which is selected from the group comprising carbon monoxide (CO), amines ($NR_3$), imines (RN=CR), pyridines, phosphines ($PR_3$), arsines ($AsR_3$), nitriles (RCN), isonitriles (RNC), ethers (ROR), disulfides (RSR) and diselenides (RSeR). Preference is given to ligands of high field strength, such as, for example, phosphines.

L may also be an anionic ligand, for example from the group of the halides ($F^-$, $Cl^-$, $Br^-$, $I^-$), pseudohalides ($CN^-$, $OCN^-$, $SCN^-$), alkylic anions (for example $CH_3^-$), arylic anions (for example $Ph^-$), alcoholates ($RO^-$), thiolates ($RS^-$), hydroxide ($OH^-$).

L is preferably X, where

X is in each case independently a singly negatively charged, monodentate ligand, for example Cl, Br, I, CN, SCN and/or OCN.

The chelate ligand $L_{CH}$ is preferably a bidentate ligand $C^\frown E$, in which:

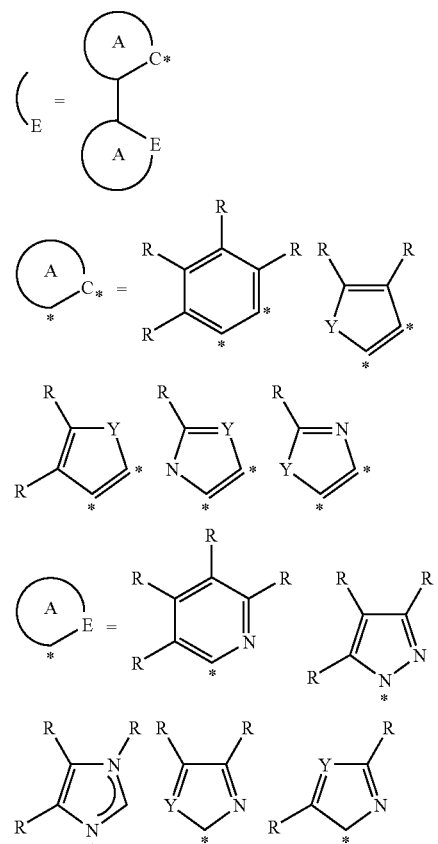

E is selected from elements from the fifth main group, such as N, As, P, or a carbene carbon $C_{carbene}$;
Y is O, S or NR.

R is in each case, independently of one another, hydrogen, halogen, in particular chloride or bromide, pseudohalogen, in particular thiocyanate, cyanate or cyanide, alkyl, aryl, heteroaryl, alkenyl, each of which may be bonded directly or via oxygen (—OR), nitrogen (—$NR_2$) or silicon (—$SiR_3$) and which may optionally be substituted by substituents such as halogens, lower alkyl groups ($C_1$-$C_6$) and other donor and acceptor groups. Two or more groups R may also be connected to one another, for example with formation of fused ring systems.

Examples of preferred anionic metal complexes of the formula (II) are:

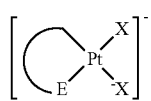

II

-continued

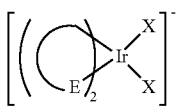
III

In a further preferred embodiment, the emitters employed are charged organic emitter molecules. These are particularly preferably fluorescent organic molecules and most preferably charged laser dyes. Preferred compounds are, for example, coumarins, rhodamines, fluoresceins, quinolines, pyrenes, cyanines, triarylmethanes, diarylmethanes, azo dyes, polyenes, polymethines, carbonyl dyes, porphyrins, corrins, phthalocyanines, xanthenes, anthraquinones and borates, which may be mono- or polysubstituted or unsubstituted. Suitable substituents are, for example, alkyl, for example $C_1$-$C_{20}$-alkyl, in particular $C_1$-$C_6$-alkyl, halogen, in particular F, Cl, Br or I, $SO_3^-$, $SO_4^-$, $COO^-$, $SO_2Cl$, $CF_3$, OH, $NH_2$, NHR, $NR_2$, where R denotes, in particular, $C_1$-$C_6$-alkyl or $C_6$-$C_{10}$-aryl, alkoxy, in particular $C_1$-$C_{20}$-alkoxy, $N(CH_2COO^-)_2$, keto, NH—CO—NH—$NH_2$, $P(OH)O_3^-$, aryl, in particular $C_5$-$C_{10}$-aryl, COOR, OCO—R, in which R denotes, in particular, alkyl, for example $C_1$-$C_{20}$-aryl, which is saturated or mono- or polyunsaturated, $CH_2CO_2^-$, $CH_2CH(CO_2H)_2$ or CN. Such molecules have a very high emission quantum yield. To date, however, their use in OLEDs was impossible owing to their charged form. With the arrangement according to the invention, in which immobilisation of charged molecules also takes place, such molecules can now be employed in OLEDs.

It is advantageous on use of charged organic emitters, in particular fluorescence emitters, that virtually all colours can be achieved using these molecules, more precisely from blue to red. Particularly preferred suitable anionic fluorescent organic emitters are depicted below.

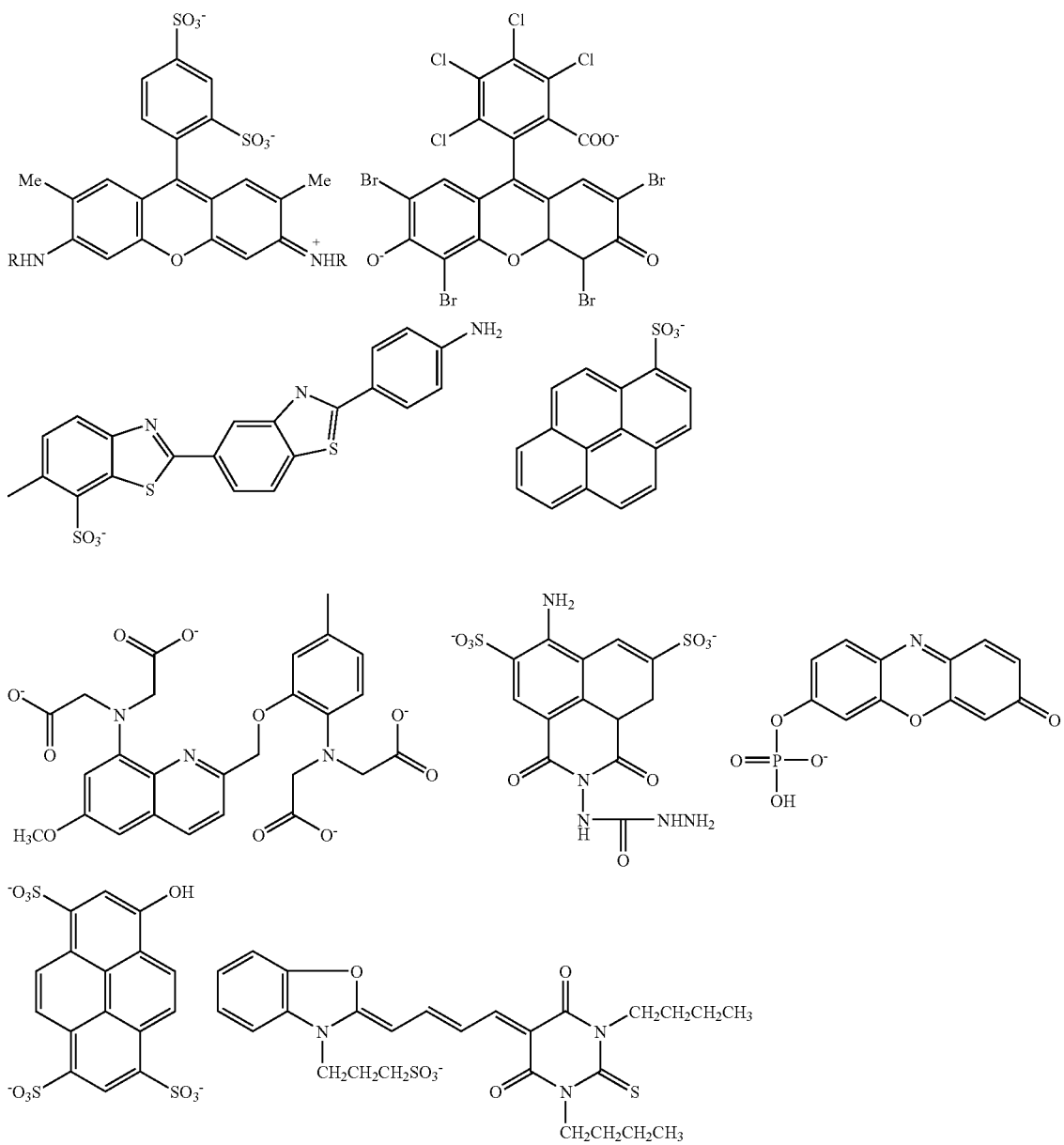

-continued
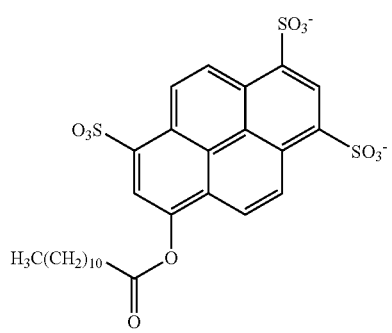
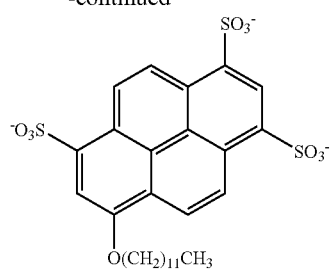
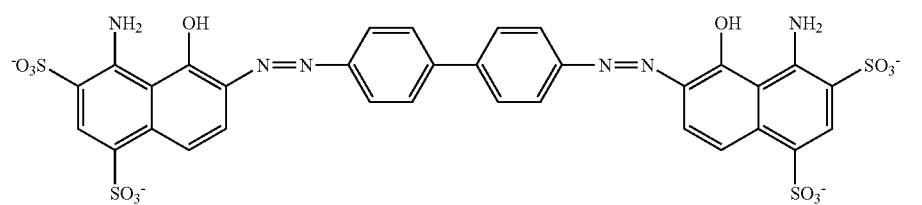
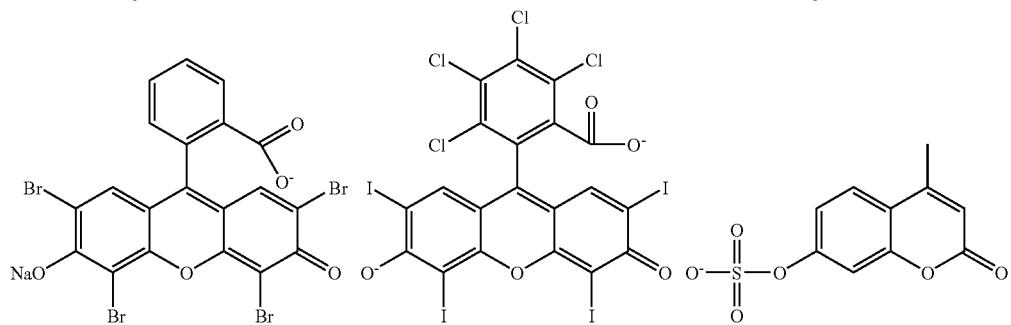
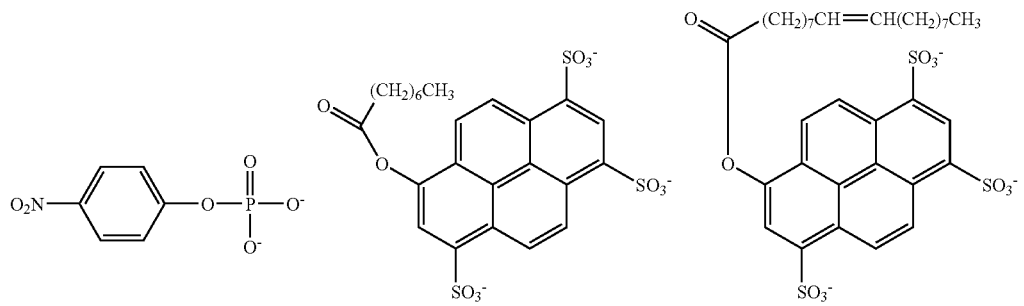
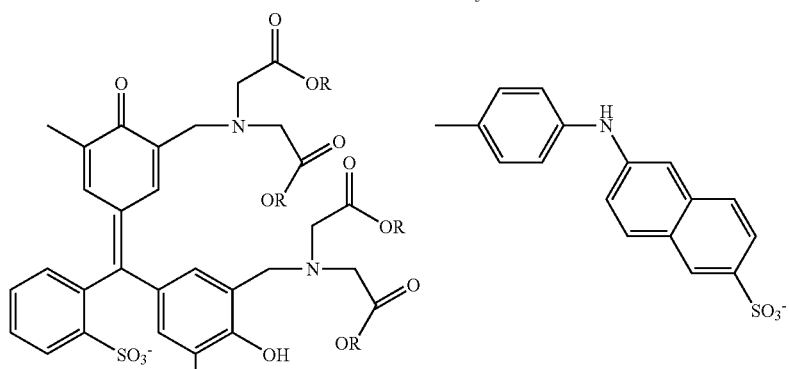
R = H, Na
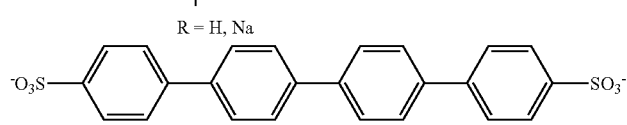

-continued
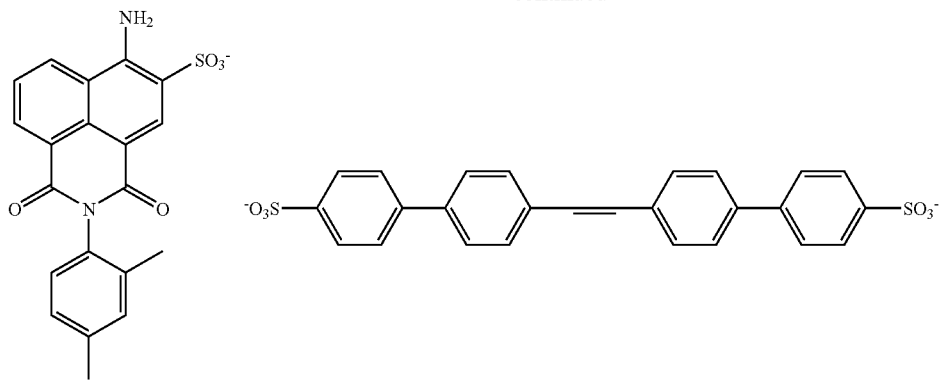
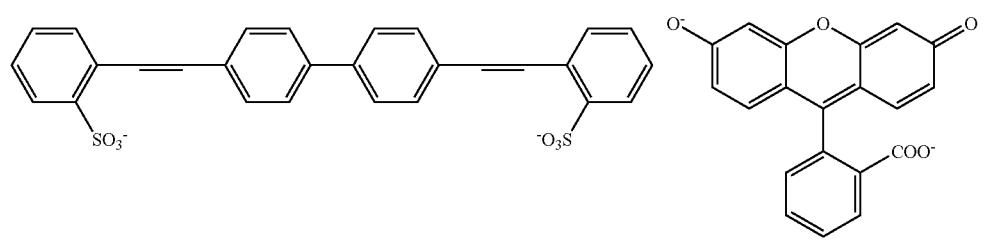
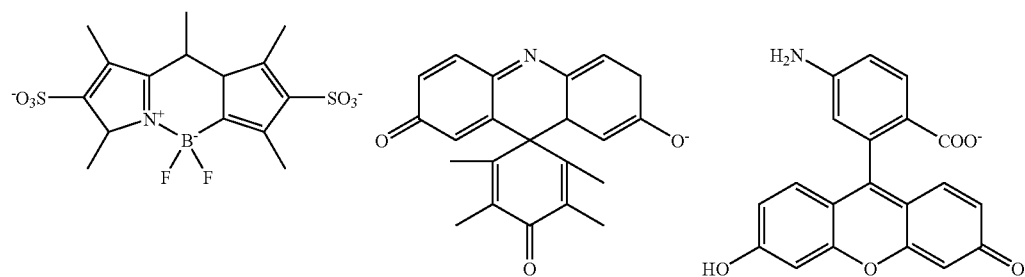
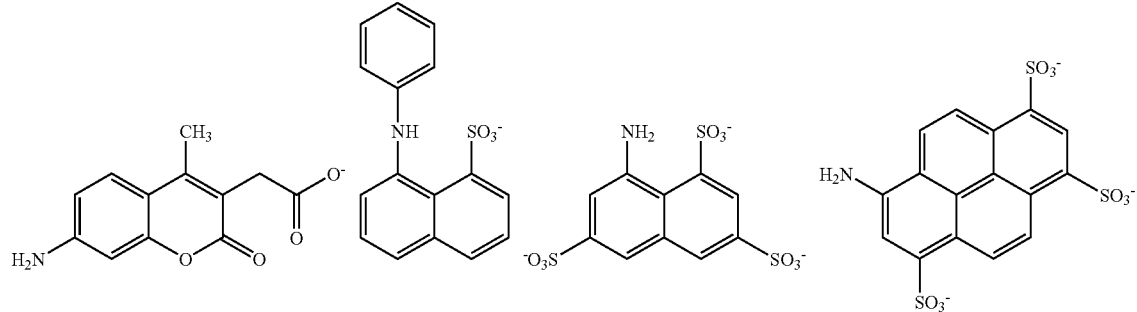
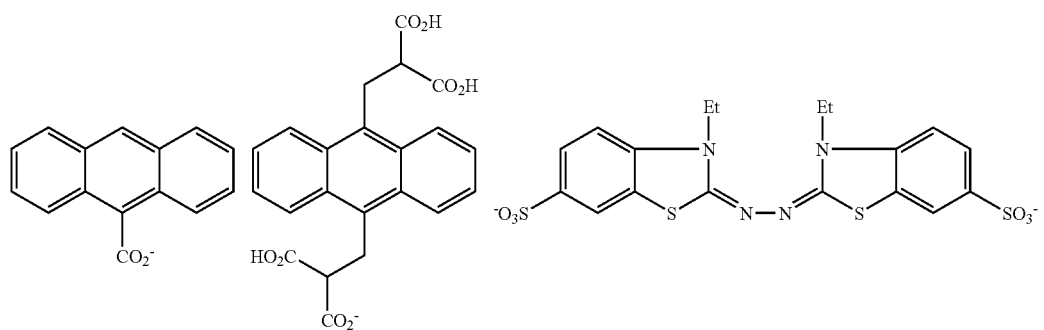

15
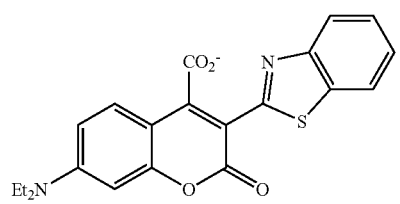
-continued
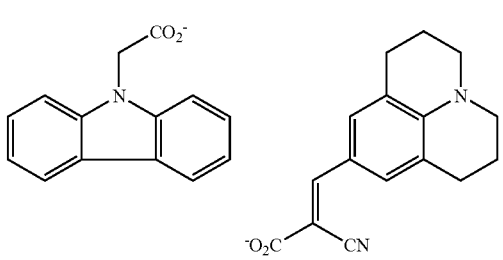
16
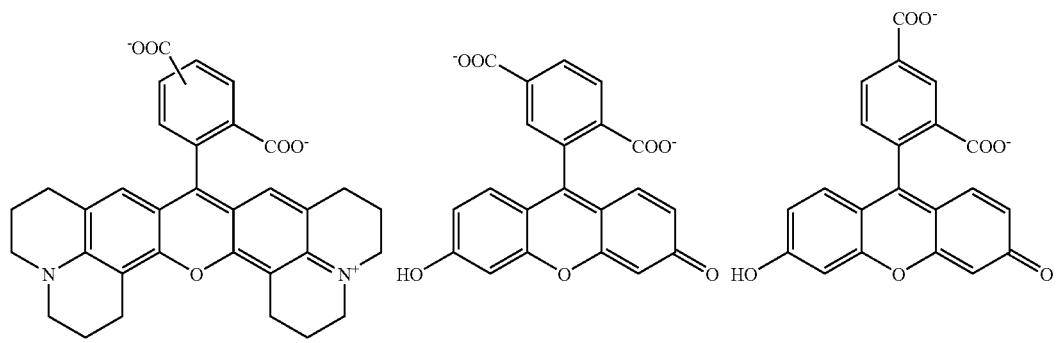
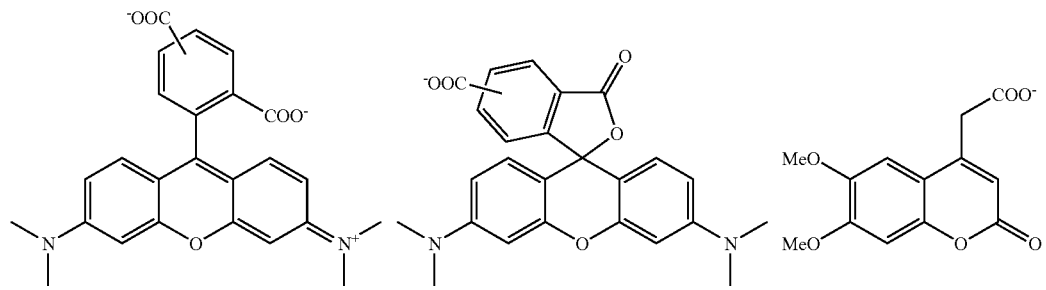
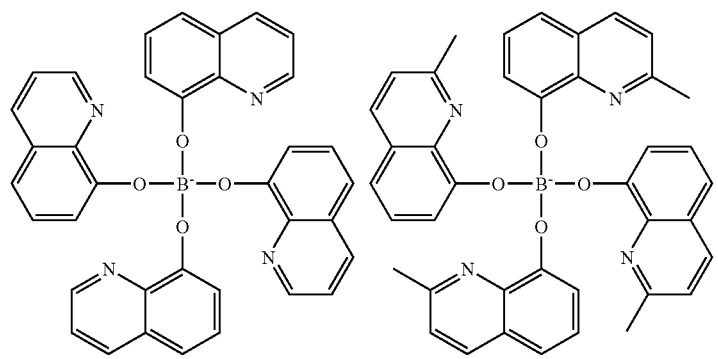

Anionic organic emitters can also be obtained by the use of acids. Suitable acids are, for example,

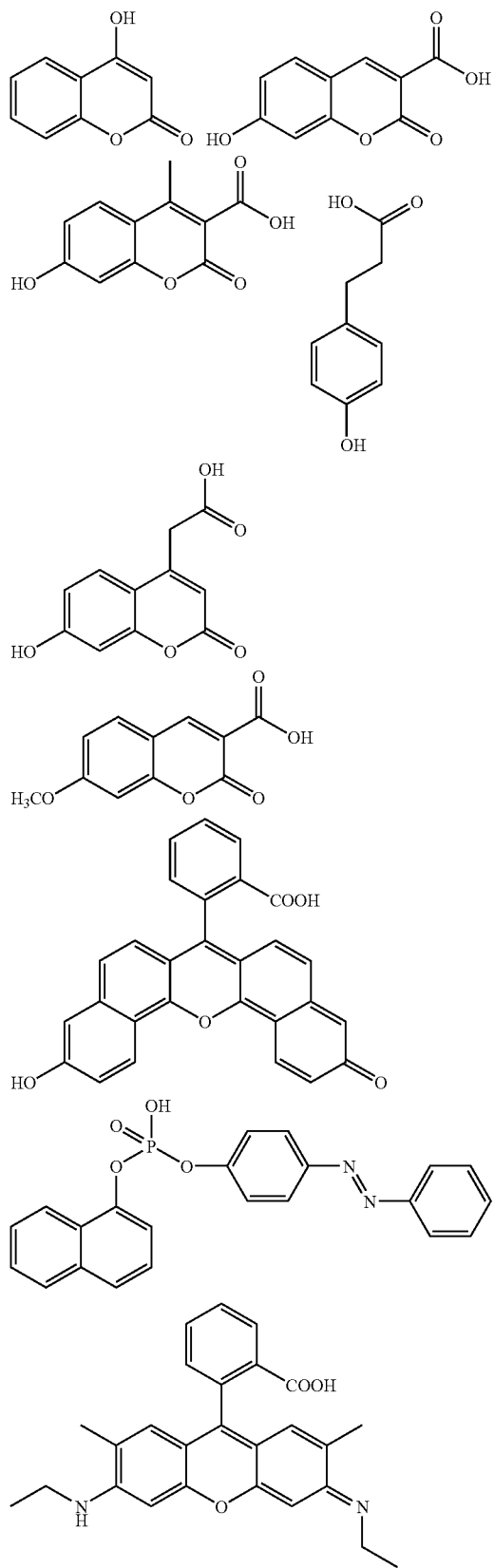

Deprotonation of the acids results in an anionic form. Thus, for example in the case of carboxylic acids, sulfonic acids or other compounds containing acidic hydrogen atoms, anions can be generated by deprotonation.

Cationic fluorescent organic emitters which are suitable in accordance with the invention can preferably be selected from the groups coumarins, rhodamines, fluoresceins, quinolines, pyrenes, cyanines, triarylmethanes, diarylmethanes, azo dyes, polyenes, polymethines, carbonyl dyes, porphyrins, corrins, phthalocyanines, xanthenes, anthraquinones and borates, which may be unsubstituted or mono- or polysubstituted.

Suitable substituents are, for example, alkyl, for example $C_1$-$C_{20}$-alkyl, in particular $C_1$-$C_6$-alkyl, halogen, in particular F, Cl, Sr or I, $SO_3^-$, $SO_4^-$, $COO^-$, $SO_2Cl$, $CF_3$, OH, $NH_2$, NHR, $NR_2$, where R denotes, in particular, $C_1$-$C_6$-alkyl or $C_5$-$C_{10}$-aryl, alkoxy, in particular $C_1$-$C_{20}$-alkoxy, $N(CH_2COO^-)_2$, keto, NH—CO—NH—$NH_2$, $P(OH)O_3^-$, aryl, in particular $C_6$-$C_{10}$-aryl, COOR, OCO—R, in which R denotes, in particular, alkyl, for example $C_1$-$C_{20}$-aryl, which is saturated or mono- or polyunsaturated, $CH_2CO_2^-$, $CH_2CH(CO_2H)_2$ or CN, as well as $NR_3^+$, where R denotes, in particular, $C_1$-$C_6$-alkyl or $C_6$-$C_{10}$-aryl, $NC_4H_4O_2$, $NC_4H_2O_2$ or SCN.

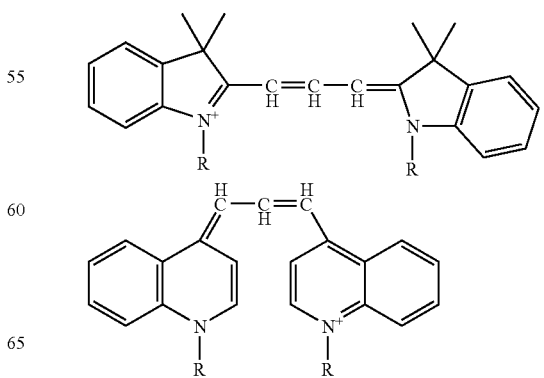

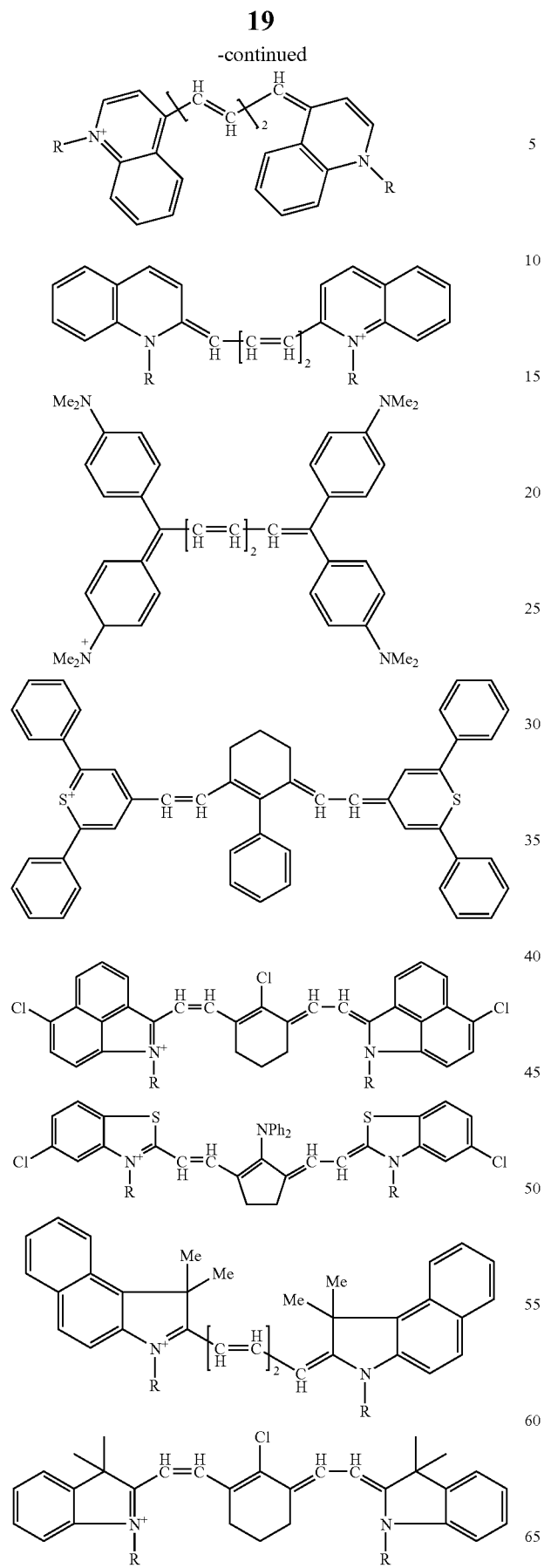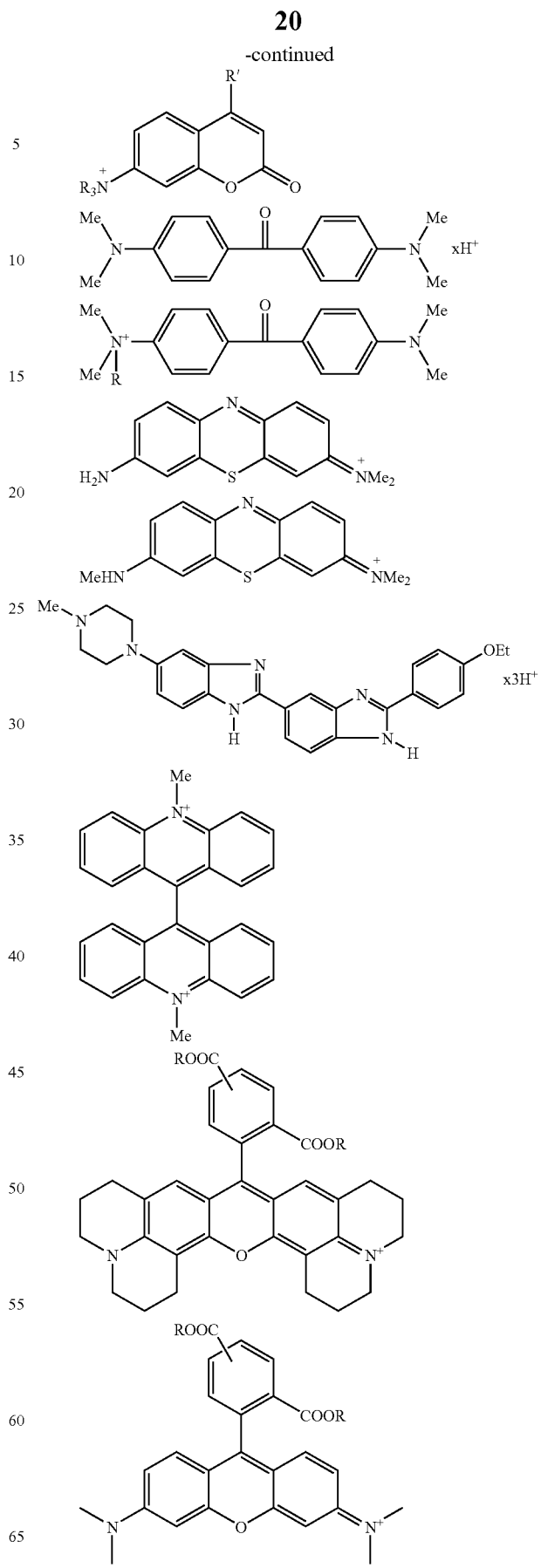

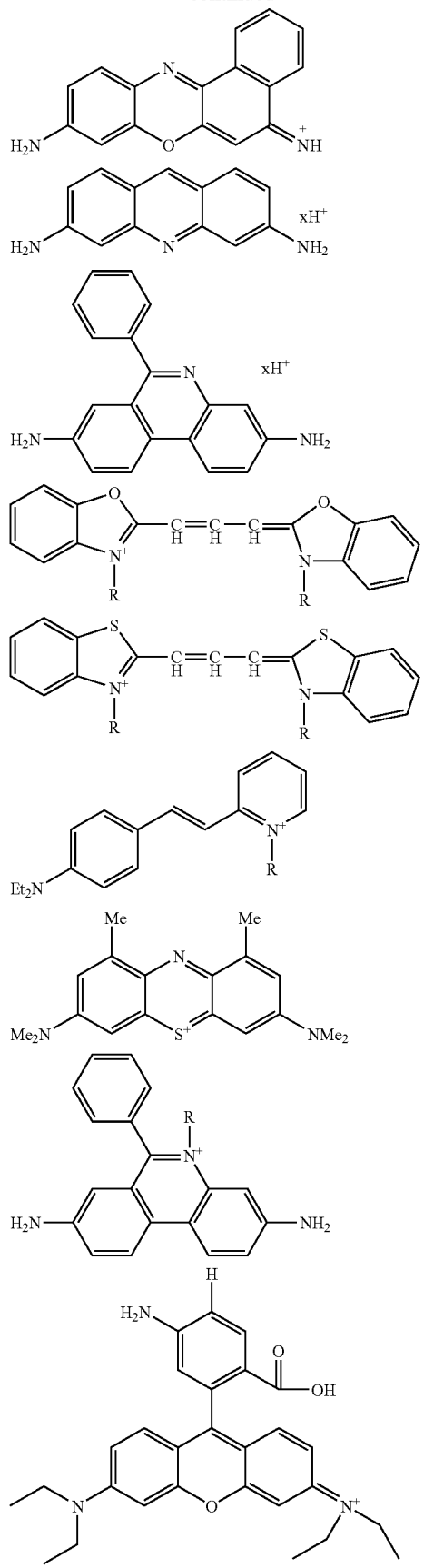
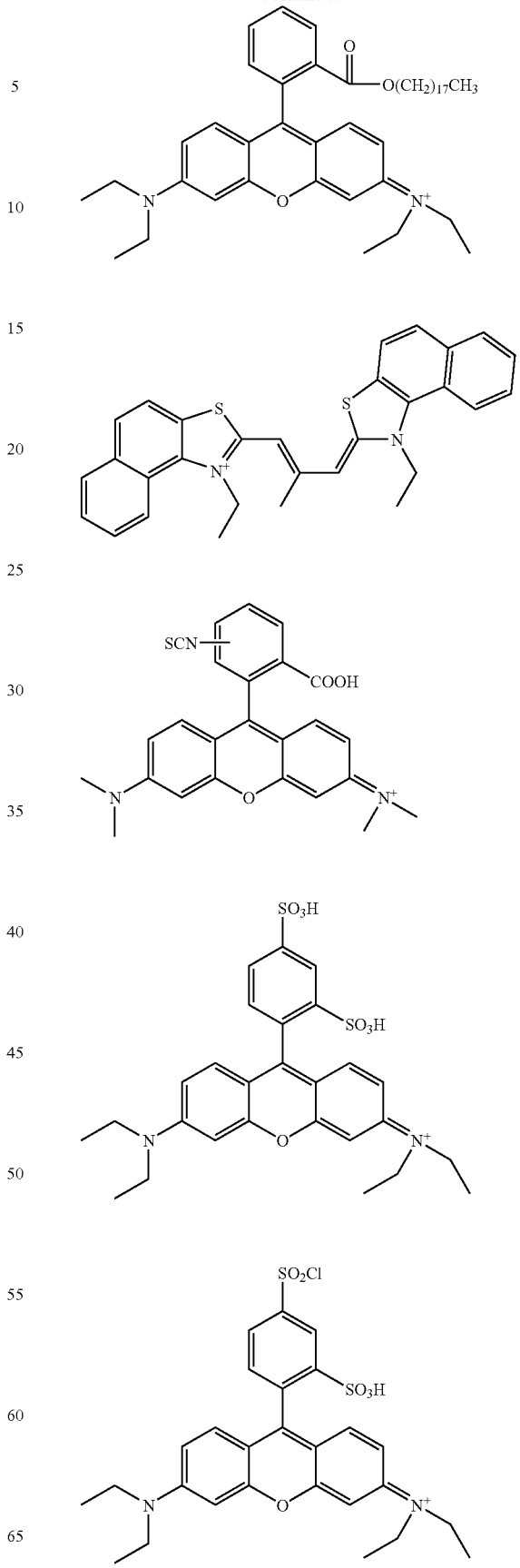

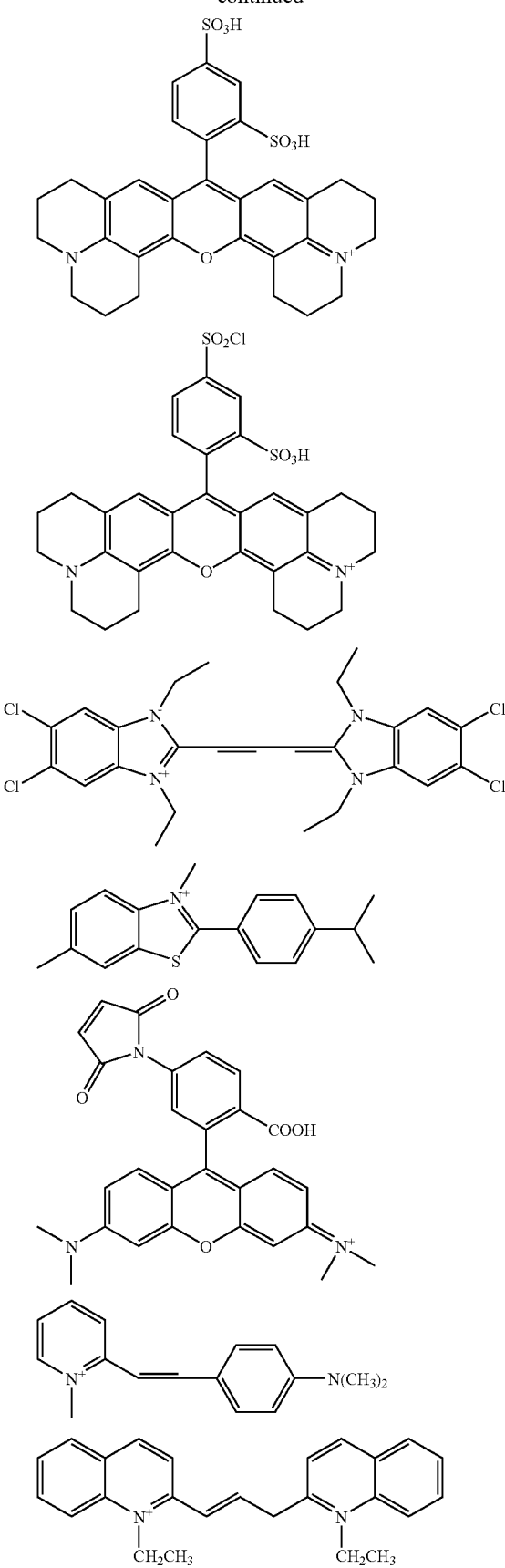
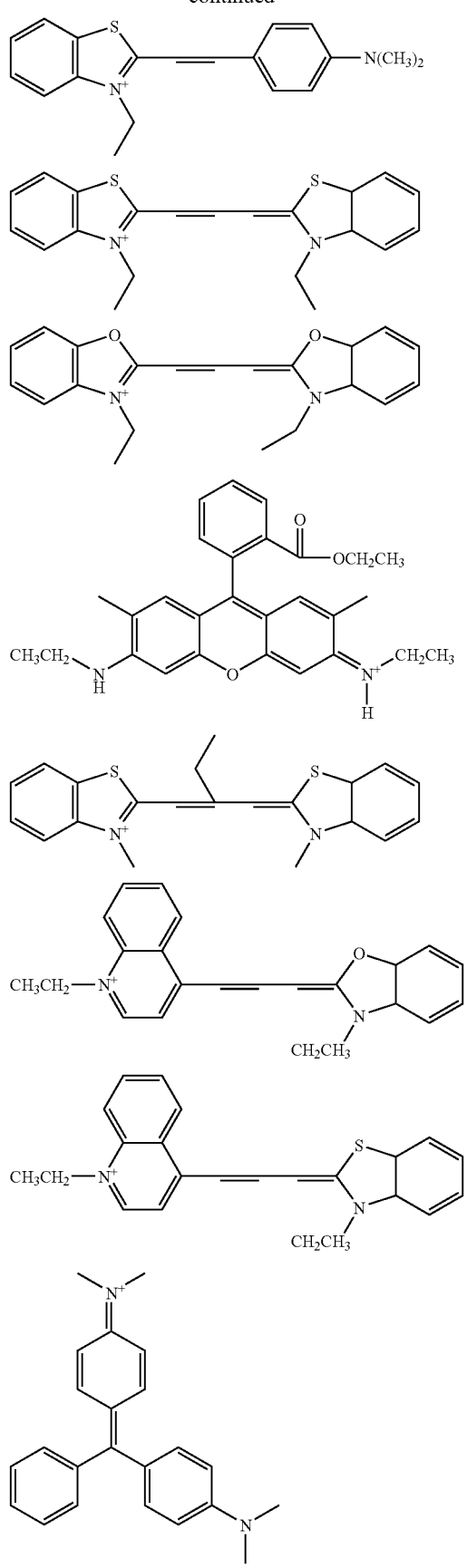

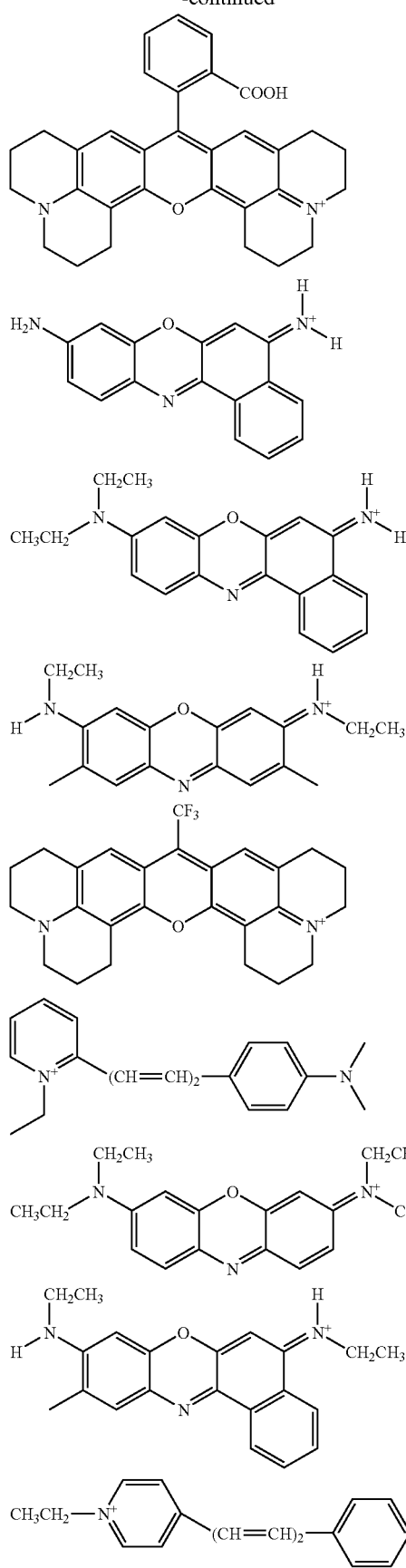
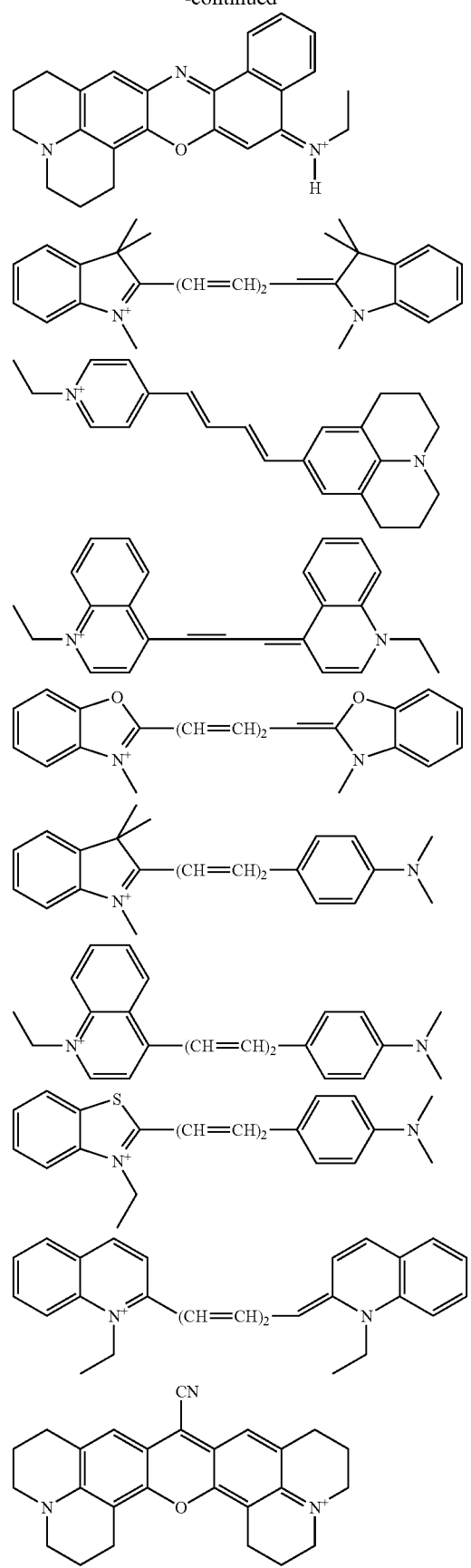

27
-continued
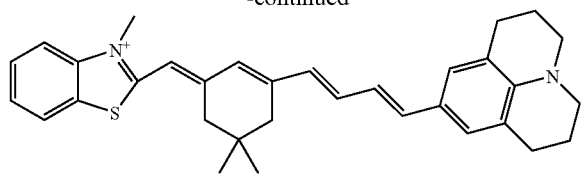
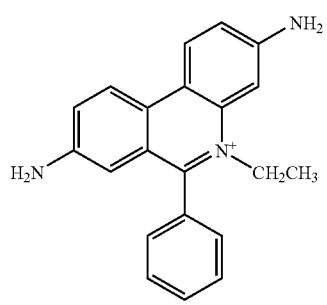
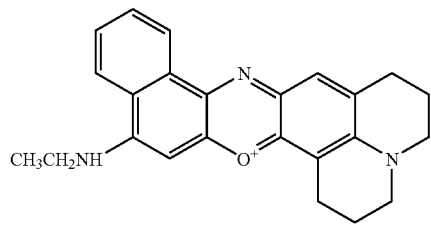
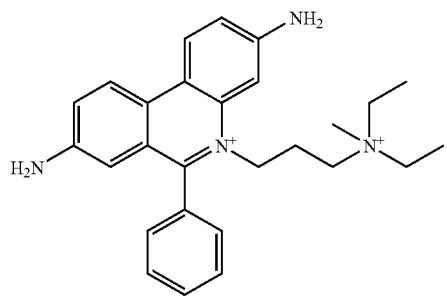
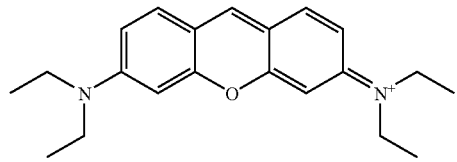
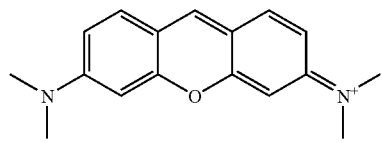
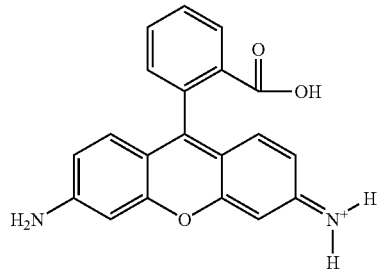
28
-continued
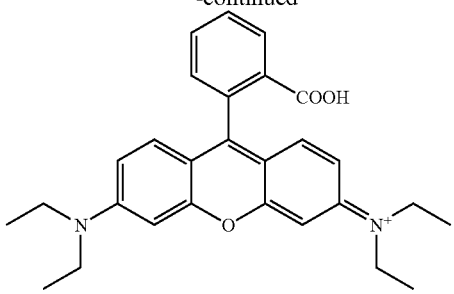
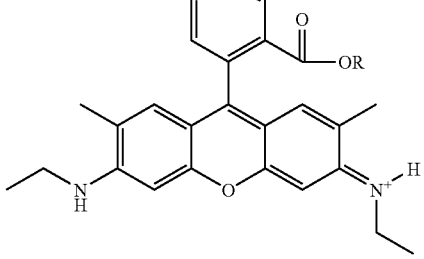
R = CH2CH3, H
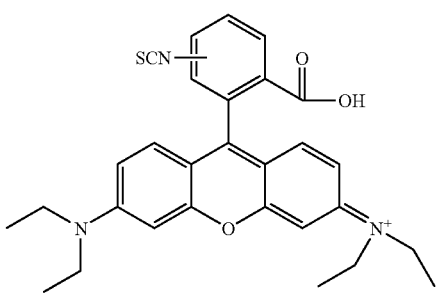
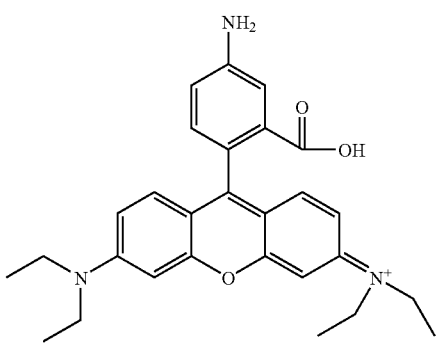
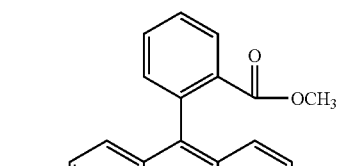
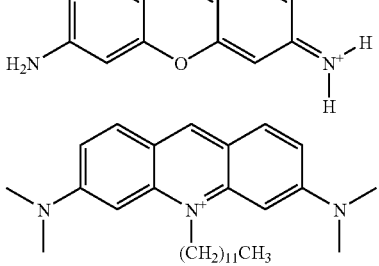

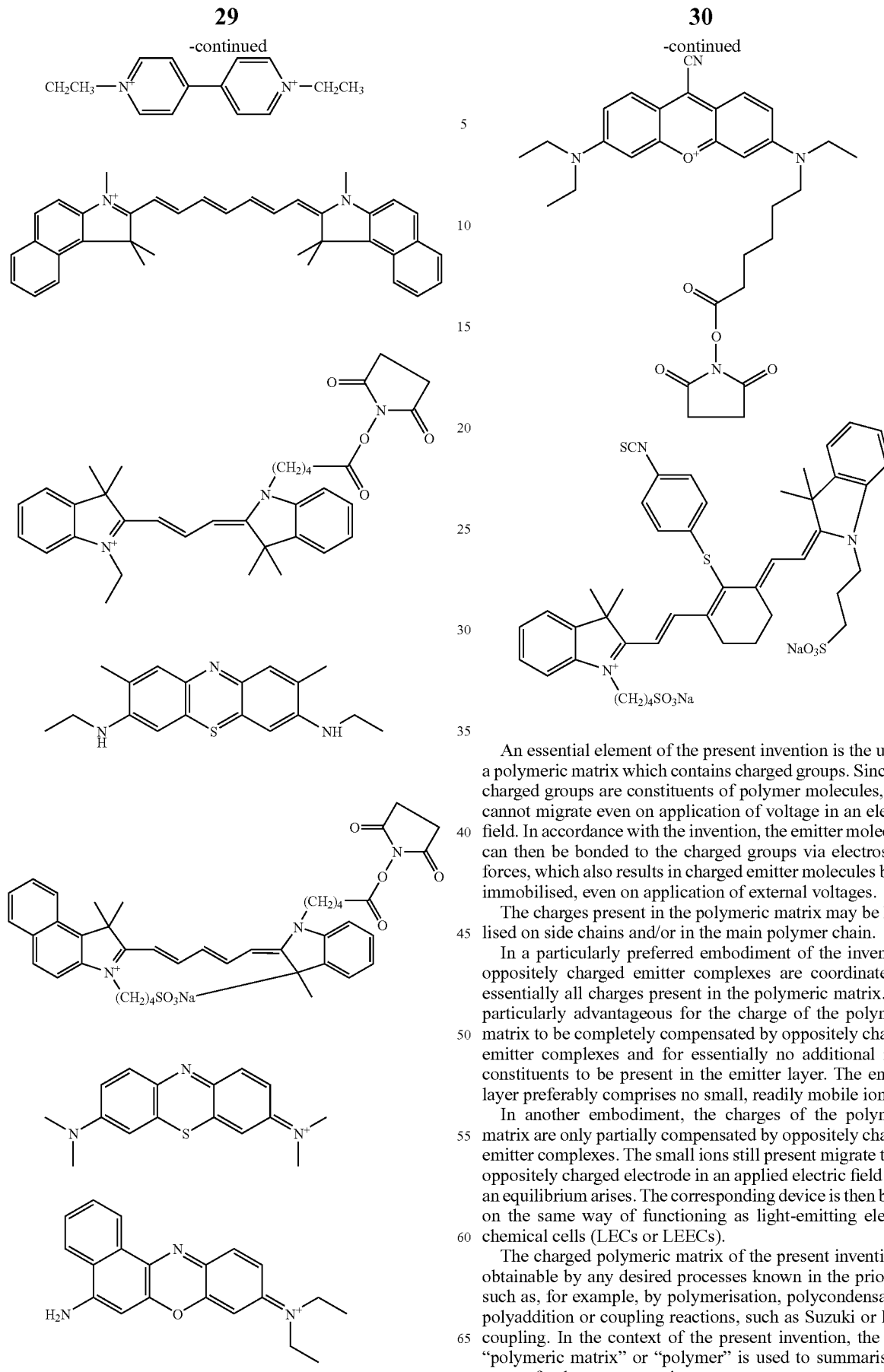

An essential element of the present invention is the use of a polymeric matrix which contains charged groups. Since the charged groups are constituents of polymer molecules, they cannot migrate even on application of voltage in an electric field. In accordance with the invention, the emitter molecules can then be bonded to the charged groups via electrostatic forces, which also results in charged emitter molecules being immobilised, even on application of external voltages.

The charges present in the polymeric matrix may be localised on side chains and/or in the main polymer chain.

In a particularly preferred embodiment of the invention, oppositely charged emitter complexes are coordinated to essentially all charges present in the polymeric matrix. It is particularly advantageous for the charge of the polymeric matrix to be completely compensated by oppositely charged emitter complexes and for essentially no additional ionic constituents to be present in the emitter layer. The emitter layer preferably comprises no small, readily mobile ions.

In another embodiment, the charges of the polymeric matrix are only partially compensated by oppositely charged emitter complexes. The small ions still present migrate to the oppositely charged electrode in an applied electric field until an equilibrium arises. The corresponding device is then based on the same way of functioning as light-emitting electrochemical cells (LECs or LEECs).

The charged polymeric matrix of the present invention is obtainable by any desired processes known in the prior art, such as, for example, by polymerisation, polycondensation, polyaddition or coupling reactions, such as Suzuki or Heck coupling. In the context of the present invention, the term "polymeric matrix" or "polymer" is used to summarise all types of polymer preparation.

The charge(s) can be introduced into the polymeric matrix after the polymer preparation. However, it is also possible to use monomeric units which are already charged for the synthesis of the charged matrix according to the invention. In addition, it is proposed in an embodiment of the invention that the charge of the matrix is only generated by combination with an emitter. For example, a polymeric matrix containing acidic groups can be deprotonated by reaction with a basic emitter and thus negatively charged.

In a preferred embodiment of the invention, the charged polymeric matrix is composed of at least two or more different monomeric units. The advantage of a copolymer consists in that the properties of the polymer can be modified correspondingly to the specific requirements. For example, the degree of crosslinking can be regulated through the choice of certain monomer units, and good film-formation, glass-temperature, hole- and electron-conductor properties can be achieved.

In a further preferred embodiment of the invention, the polymeric matrix is composed of charged and uncharged units. A polymer which is composed only partially of units containing charged groups has the advantage that essentially complete coverage of the matrix with oppositely charged emitters can be achieved more easily. Thus, the presence of additional charge carriers can be avoided in accordance with the present invention, and it is possible, in particular, to produce an emitter layer which contains no small, readily mobile ions.

A matrix of this type is obtainable, for example, by subsequently introducing charges into a polymer at some sites, while others remain uncharged. Thus, for example, a polymeric organic nitrogen compound can be partially quaternised by selecting the amount of quaternising agent used non-stoichiometrically, but instead correspondingly lower. Analogously, for example, some of the acid groups in a polymer can be deprotonated. In addition, it is possible to use a copolymer comprising two or more different charged and uncharged monomer units.

Suitable negatively charged polymeric matrix materials in accordance with the present invention are polymers which contain a deprotonatable group. Examples of negatively charged groups whose charge is (formally) achieved by deprotonation are sulfonates, carboxylates, alcoholates, thiolates and mono- and diesters of orthophosphoric acid. Examples of anionic (deprotonated) polymers are:

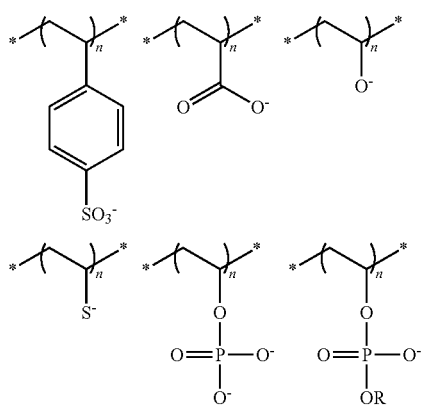

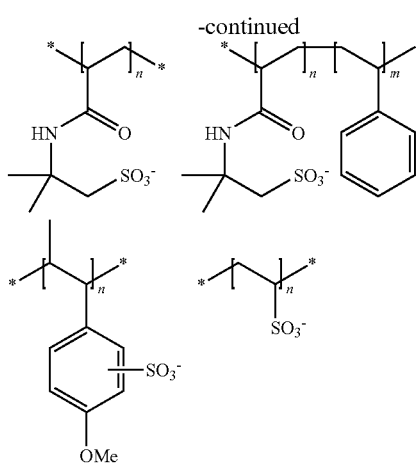

n and m herein denote, unless indicated otherwise, in each case independently the number of recurring units and in particular a number from 3 to 10,000, preferably 10 to 1000 and particularly preferably 20 to 500.

The combination according to the invention of a positively charged emitter material complex and a negatively charged polymeric matrix can be prepared in accordance with the present invention by reacting a basic metal complex, such as, for example, $[(bpy)_3Ru]^{2+}(OH)_2$, with an acidic polymer. In a neutralisation reaction of this type, water, for example, is formed as byproduct, which can be removed simply by standard methods. In addition, in a neutralisation reaction according to the invention of acidic matrix polymer and basic emitter-metal complex, no further interfering impurities form which would under certain circumstances have to be removed in a purification step. In this way, the degree of coverage can in addition be adjusted very simply.

A further polymeric matrix according to the invention having a negative charge is a polymer containing permanent anionic groups. Examples of permanent anionic side groups are tetraorganylborates. These may be bonded to a polymer as side chain, for example via linker groups L'. On the other hand, the permanent anionic groups may also be a constituent of a main polymer chain.

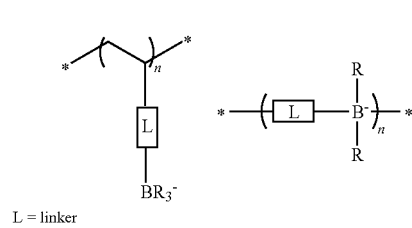

L = linker

The linker L' is preferably an alkyl or aryl group. R is as defined above.

As already stated above, the anionic polymeric matrix can be a copolymer comprising two or more different monomers. The properties of the polymeric matrix can thus be controlled specifically.

The cationic polymeric matrix used in accordance with the invention can be polymeric nitrogen compounds, such as amines, amides, imines and enamines in which some or all of the nitrogen atoms are quaternised. The nitrogen may be a constituent of the main polymer chain or in particular a side group. Polymeric aromatic nitrogen compounds are frequently employed as hole conductors (for example PVK=polyvinylcarbazole) and are therefore also of interest for use in the matrix according to the invention.

Commercially available polymerisable primary amines are, for example:

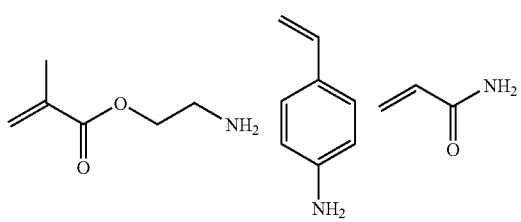

A positively charged polymeric matrix can be prepared in accordance with the present invention by at least partially quaternising a polymeric aromatic nitrogen compound using a quaternising reagent.

Examples of polymeric quaternary nitrogen compounds are:

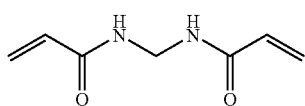

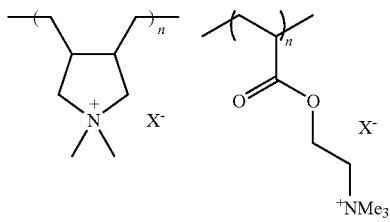

in which
X is selected from the group comprising halogen, for example Cl, Br, I, pseudohalogen, for example CN, SCN, OCN, tosylate, triflate. R is as defined above.

Further examples of polymeric quaternary nitrogen compounds are:

Polyquaternium-2

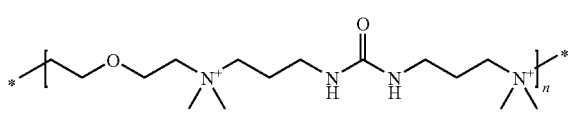

poly(3,3',4,4'-benzophenonetetracarboxylic dianhydride-alt-ethidium bromide)

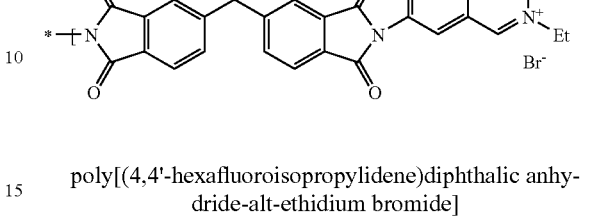

poly[(4,4'-hexafluoroisopropylidene)diphthalic anhydride-alt-ethidium bromide]

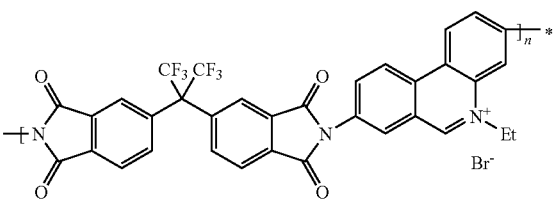

poly(pyromellitic dianhydride-alt-ethidium bromide

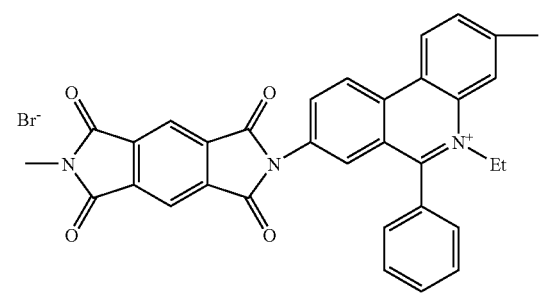

The cationic polymeric matrix employed may also be ternary sulfur compounds, such as, for example, poly(3,3',4,4'-benzophenonetetracarboxylic dianhydride-alt-thionine)

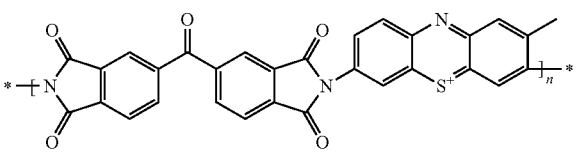

poly[(4,4'-hexafluoroisopropylidene)diphthalic anhydride-alt-thionine]

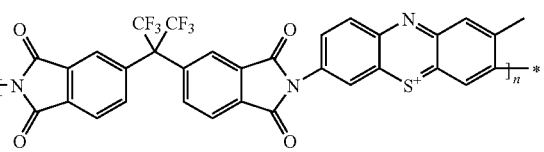

poly(pyromellitic dianhydride-co-thionine)

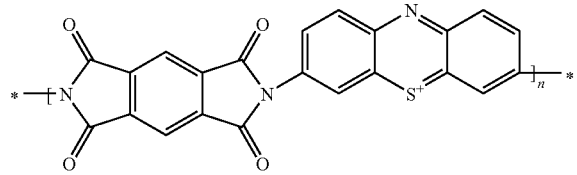

Examples of quaternising reagents are alkylating agents of the general form R—X, in which R represents an alkyl radical, such as methyl, ethyl, propyl or butyl, and in which X preferably represents a good leaving group, such as iodide, bromide, tosylate, triflate, etc. An example of a particularly suitable quaternising reagent is MeI. Use of methyl iodide results in an iodide-containing polymer results. If necessary, it is possible to replace iodide with other anions, such as $Cl^-$ or $CN^-$.

In a variant of the present invention, only some of the nitrogen atoms present in the polymeric nitrogen compound, in particular in the polymeric aromatic nitrogen compound, are quaternised.

The partial quaternisation proceeds, for example, as follows:

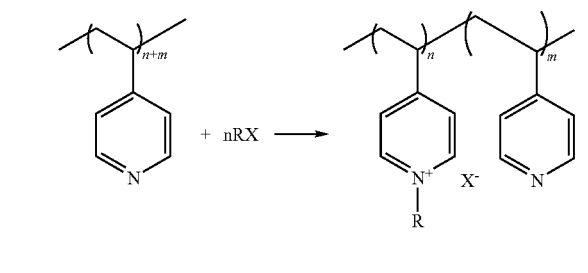

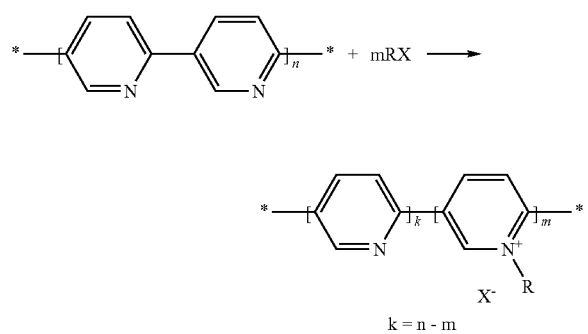

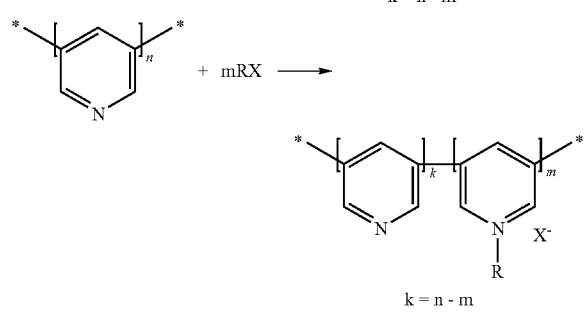

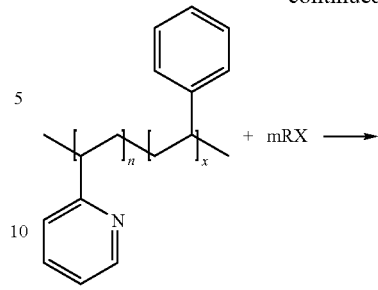

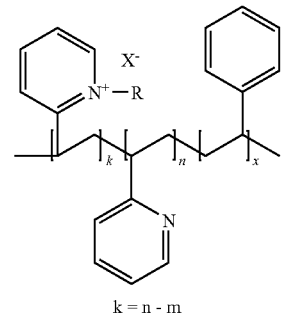

k = n - m

A further example of a partially quaternised polymeric nitrogen compound is:

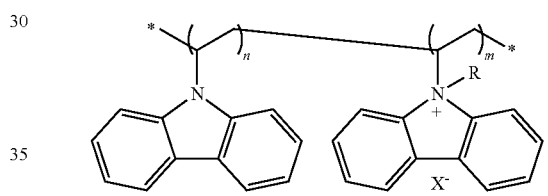

in which X and R are as defined above.

The partial quaternisation of a polymeric nitrogen compound and in particular a polymeric aromatic nitrogen compound has the advantage that the quaternisation proceeds randomly and the degree of coverage can be set readily. However, coordination-capable nitrogen atoms are left behind, which may have an effect on the emission properties of the emitter.

It is advantageous for an emitter molecule to be coordinated to each positively charged quaternary ammonium group in a polymeric matrix. In order to achieve the most complete coverage of the polymer possible, it is favourable for the polymeric matrix to comprise further different monomers, for example non-quaternised aromatic nitrogen compounds or other monomer units, besides quaternary aromatic nitrogen compounds. The properties of the polymeric matrix can be controlled via the choice of the further neutral monomers.

The copolymerisation proceeds, for example, as follows:

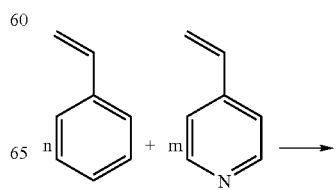

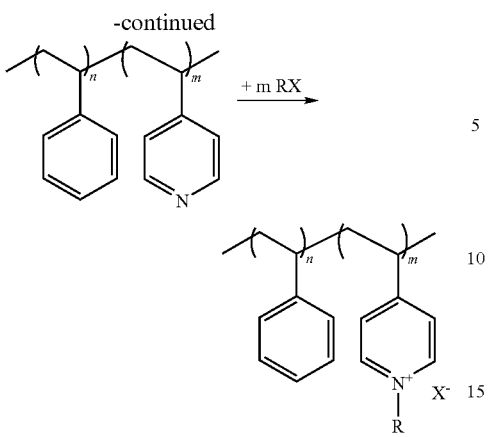

A further example of a copolymer according to the invention is:

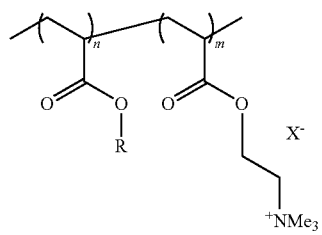

Another procedure for the preparation of a positively charged matrix according to the invention comprises the polymerisation of monomers in which quaternary N atoms are present. Since very clean (monomer) compounds are available as starting compounds, the resultant polymers also have a well-defined composition.

Examples of monomeric quaternary salts are:

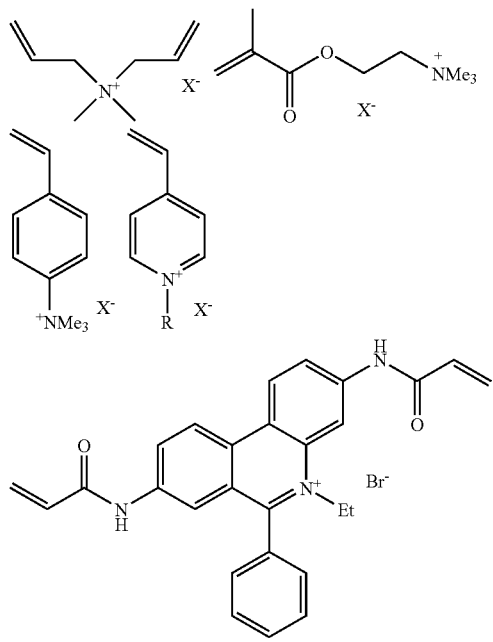

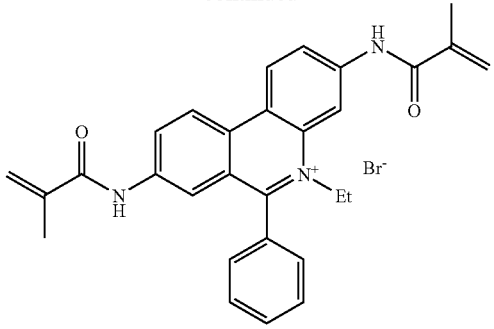

The polymerisation of monomeric quaternary salts has the advantage that a polymerisation can be carried out directly on a substrate, such as, for example, ITO. In addition, it is possible to combine the monomeric quaternary salts with other monomers in order specifically to modify the properties of the polymeric matrix. For example, it is possible to modify the degree of crosslinking, film-formation, glass-temperature, hole- and electron-conductor properties through the choice of the other monomers.

In an embodiment of the present invention, the charged emitter is only bonded via electrostatic interaction to an oppositely charged polymeric matrix.

In another embodiment, the charged emitter is additionally covalently bonded to a polymer or is a constituent of a polymer. The covalent bonding immobilises the emitter and further restricts its movement. The emitter here may be bonded to side chains of the polymer and/or itself be a constituent of the main polymer chain. The emitter is preferably a charged triplet emitter-metal complex.

In a variant of this embodiment, the charged emitter is bonded to an oppositely charged polymeric matrix via electrostatic interaction and in addition by covalent bonding to a second polymer. The second polymer is preferably itself uncharged.

In another variant of this embodiment, the polymer is the oppositely charged polymeric matrix. The charged emitter is then electrostatically and covalently bonded to the matrix. In this variant, the emitter layer thus comprises a polymeric zwitterion, which is composed of a charged emitter and an oppositely charged matrix.

The emitter may be bonded to side chains of a polymer or be a constituent of a main polymer chain. For covalent bonding of an emitter to a polymer, numerous possibilities are known in the prior art, and the present invention is not intended to be limited to a certain bonding possibility. For example, emitter-metal complexes which contain a functional group on at least one ligand can be bonded to a side chain of a polymer via one or more ligands. Alternatively, it is possible to achieve bonding via functional groups of a ligand by reaction with functional groups of a polymer. A metal complex may also be bonded via the functionality of a ligand to a monomer which is subsequently converted into a polymer. Alternatively, an emitter which itself contains polymerisable groups, for example on one or more ligands of a metal complex, can be polymerised. In the context of the present invention, the term "polymerise" or "polymerisation" is used to summarise all types of polymer generation. In accordance with the present invention, a polymer can be formed, for example, by polymerisation, polycondensation, polyaddition and/or coupling reactions, for example by Heck or Suzuki coupling.

In a preferred embodiment of the invention, the charged emitter is bonded to a polymer which is composed of at least two different monomeric units. The advantage of a copolymer consists in that the properties of the polymer can be modified depending on the requirements. The use of certain monomer units enables, for example, good film-formation ability and hole and electron conductivity, etc., to be achieved.

In an embodiment of the invention, the charged metal complex is a constituent of a main polymer chain. For example, an emitter complex which has at least two functionalities on its ligands may be present as monomer unit in a polymer chain. A metal complex is advantageously combined as monomer unit with further monomers and incorporated into a polymer chain by polymerisation, polycondensation, polyaddition, coupling reactions, metathesis and others.

In a further embodiment, at least two different charged emitters are used. Each individual one of these emitters may be bonded, as indicated above, to an oppositely charged polymeric matrix merely via electrostatic interactions or additionally covalently bonded to a polymer or be a constituent of a polymer. The emitters here may be bonded to side chains of a polymer or be a constituent of the main polymer chain, the polymer can be a copolymer.

The use of a plurality of different emitters enables the emission spectrum to be modified depending on their concentrations in the layer. In particular, the use of two or more triplet emitters enables the generation of white light.

Examples of Polymer-Bound Anionic Emitters:

In order to achieve a restriction in the ion mobility, both anions and cations can be immobilised, as explained above, which may also be achieved by covalent bonding of the emitters to polymers. This is possible, for example, if the emitter contains a functional group on the ligand which is sufficiently reactive to form a bond to a monomer or polymer. An example which may be mentioned is the ligand 4-(2-pyridyl)benzaldehyde, which forms an imine on reaction with a primary amine (monomer or polymer) and thus forms the link between emitter and polymer.

It should be pointed out here that this represents only one of the possible examples since each reaction which functionalises the cyclometallating ligand through polymerisable groups can be used in principle.

An interesting variant is to make the metal centre a constituent of the anionic polymer chain and not only to bond it to a side chain. For compensation of the negative charge, the material contains a polycation.

One possible implementation is to functionalise the emitter complexes by means of corresponding groups which then react to form polymers. Two examples are intended to explain this principle:

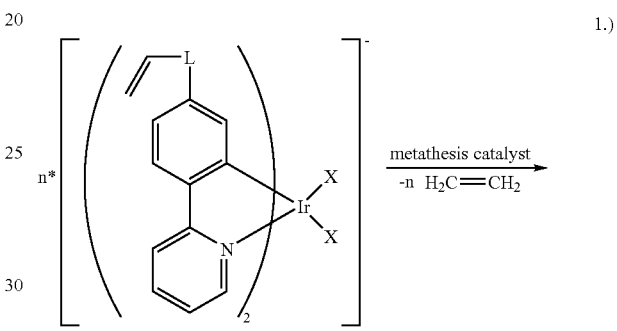

1.)

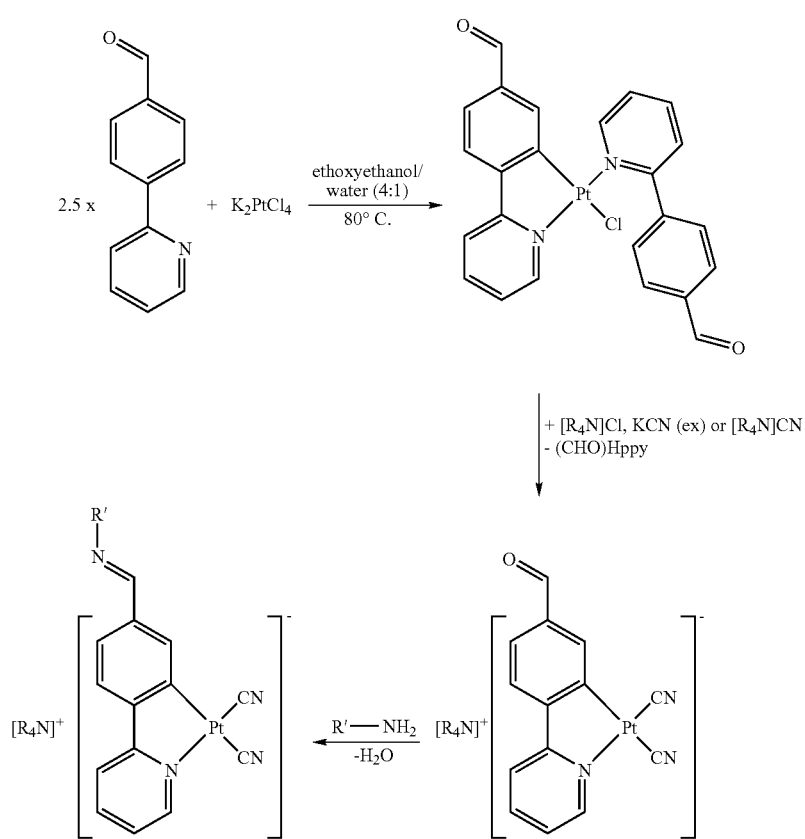

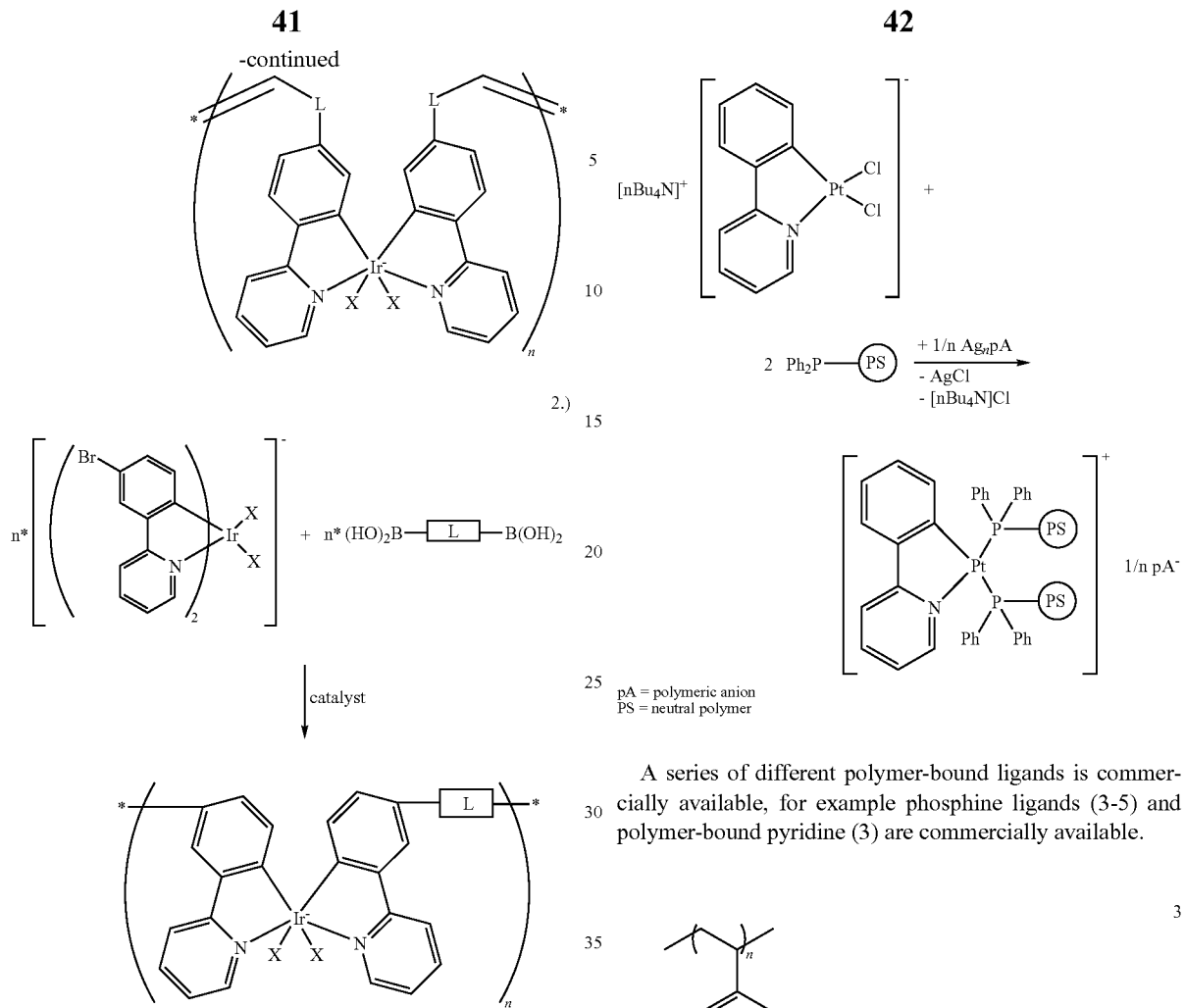

2.)

pA = polymeric anion
PS = neutral polymer

The first example shows an iridium complex functionalised by means of two vinyl groups (L' represents a linker, for example an alkyl group, which should be sufficiently long, or groups which have, for example, hole- or electron-conductor properties), which is polymerised by a metathesis reaction. Copolymerisation with a further divinyl compound is advantageous here in order thus to be able to set the emitter concentration better. An analogous principle is the use of poly-coupling reactions (for example Suzuki, Heck, and the like) and other polymerisation reactions (polycondensation, polyaddition, etc.). It is likewise possible to use polymers or oligomers containing end groups which are suitable for a further polymerisation.

It is again possible here for the polymer to be zwitterionic (with an anionic emitter complex and with the cation in the side chain or as a constituent of the polymer chain). Copolymerisation with monomers which carry further functionalities (hole or electron conductivity) is also possible.

Examples of Polymer-Bound Cationic Emitters

Very pronounced immobilisation can also be achieved if the cationic emitter complex is immobilised by means of a polymer. To this end, it is advantageous to use a polymer which contains ligands of relatively high ligand field strength. The following example is intended to explain this:

A series of different polymer-bound ligands is commercially available, for example phosphine ligands (3-5) and polymer-bound pyridine (3) are commercially available.

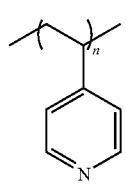

3

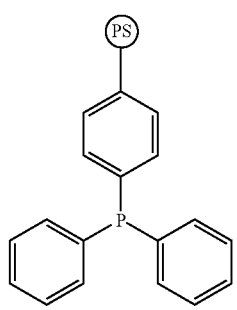

4

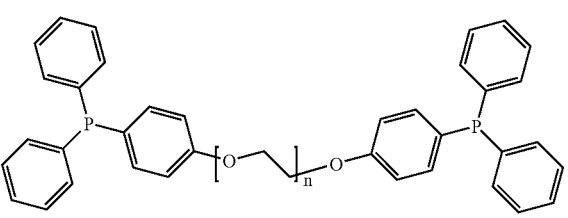

5

Problems are frequently caused in such systems during complex formation by gel formation due to crosslinking of different polymer strands, which can result in difficulties in purification and processing of the polymeric materials. One way of avoiding these problems is therefore the synthesis of a polymeric bisphosphine, such as, for example, the polyphosphine 7, which can be prepared from bis(diphenylphosphino)methane (dppm) by reaction with nBuLi and p-vinylbenzyl chloride and can be polymerised by means of free radicals, anionically, cationically or catalytically. The small bite angle of the chelating ligand means that crosslinking during complex formation can be substantially excluded.

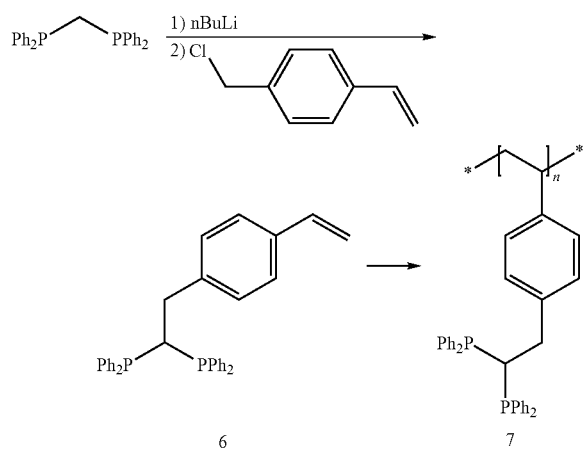

Again, the metal centre may be a constituent of the cationic polymer chain and not only bonded to a side chain. Polymers of this type are generally known as coordination polymers. For compensation of the positive charge, the material again contains a polyanion. This class of compounds thus differs from the polymer-bound emitter complexes already known from the literature, which always contain non-polymeric (molecular) anions as counterion (for example $Cl^-$, $BF_4^-$, $PF_6^-$, triflate, etc.).

A number of strategies are available for implementation: for example, metal-containing precursors can react directly through the addition of an at least bifunctional ligand to give coordination polymers.

On the other hand, the emitter complexes can also be functionalised by means of corresponding groups which then react to give polymers. Two examples are intended to explain this principle:

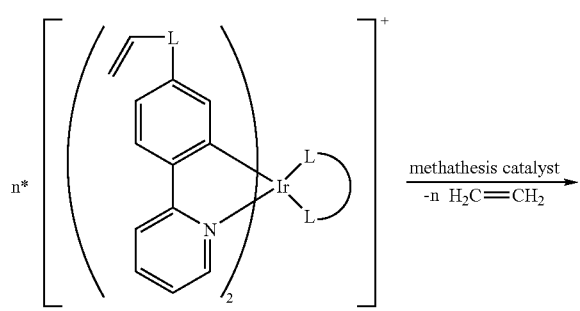

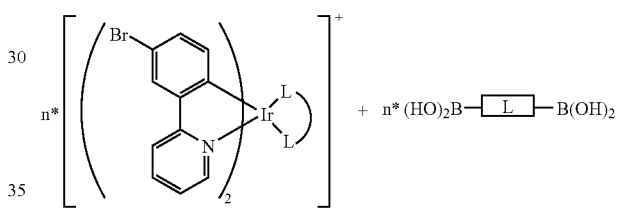

The first example shows an iridium complex functionalised by means of two vinyl groups (L' represents a linker, for example an alkyl group, which should be as long as possible, or groups which have, for example, hole- or electron-conductor properties), which is polymerised by a metathesis reaction. Copolymerisation with a further divinyl compound is certainly advantageous here in order thus to be able to set the emitter concentration better. An analogous principle is the use of polycoupling reactions (for example Suzuki, Heck, and the like) and other polymerisation reactions (polycondensation, polyaddition, etc.). A further possibility is the use of polymers or oligomers containing end groups which are suitable for a further polymerisation.

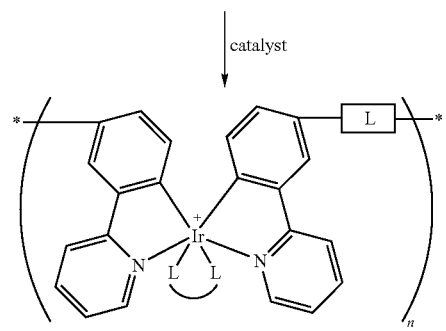

It is again possible here for the polymer to be zwitterionic (with a cationic emitter complex and the anion in the side chain or as a constituent of the polymer chain). Copolymerisation with monomers which carry further functionalities (hole or electron conductivity) is also possible.

The structure of the light-emitting device according to the invention can correspond to that of any desired known device from the prior art described above. The structure of OLED devices is described in detail, for example, in US2005/0260449 A1 and in WO 2005/098988 A1.

The way in which an embodiment of the light-emitting devices according to the invention functions is shown diagrammatically in FIG. 1, The device comprises at least one anode, at least one cathode and at least one emitter layer. One or both of the electrodes used as cathode or anode is advantageously transparent, so that the light can be emitted through this electrode. The transparent electrode material used is preferably indium tin oxide (ITO). A transparent anode is particularly preferably employed. The other electrode may likewise be made of a transparent material, but may also be formed from another material having a suitable electron work function if light is only to be emitted through one of the two electrodes. The second electrode, in particular the cathode, preferably consists of a metal having a low electron work function and good electrical conductivity, for example aluminium or silver or an Mg/Ag or Ca/Ag alloy.

An emitter layer is arranged between the two electrodes. This may be in direct contact with the anode and cathode or in indirect contact, where indirect contact means that further layers are present between the cathode or anode and the emitter layer so that the emitter layer and the anode and/or cathode do not touch one another, but instead are in electrical contact with one another via further interlayers. On application of a voltage, for example a voltage of 3-20 V, in particular 5-10 V, negatively charged electrons leave the cathode, for example a conductive metal layer, for example an aluminium cathode, and migrate in the direction of the positive anode. Positive charge carriers, so-called holes, in turn migrate from this anode in the direction of the cathode, in accordance with the invention, the organometallic complexes of the formula (I) or (II) are located as emitter molecules in the emitter layer arranged between the cathode and anode. The migrating charge carriers, i.e. a negatively charged electron and a positively charged hole, recombine at the emitter molecules or in the vicinity thereof and result in energetically excited states of the emitter molecules. The excited states of the emitter molecules then release their energy as light emission.

The light-emitting devices according to the invention may comprise a plurality of further layers, in particular an electron-injection layer and an electron-conduction layer (for example $Alq_3$=Al 8-hydroxyquinoline or β-Alq=Al bis-(2-methyl-8-hydroxyquinolato)-4-phenylphenolate) and/or a hole-injection layer (for example CuPc=Cu phthalocyanine) and/or hole-conduction layer (for example α-NPD=N,N'-diphenyl-N,N'-bis(1-methyl)-1,1'-biphenyl-4,4'-diamine). However, it is also possible for the emitter layer to take on functions of the hole- or electron-conduction layer.

In a particularly preferred embodiment, the light-emitting device according to the invention also has a CsF interlayer between the cathode and the emitter layer or an electron-conductor layer. This layer has, in particular, a thickness of 0.5 nm to 2 nm, preferably about 1 nm. This interlayer predominantly effects a reduction in the electron work function.

Furthermore, the light-emitting device is preferably applied to a substrate, for example a glass substrate.

An OLED structure for a soluble emitter according to the invention particularly preferably has the structure described below and depicted in FIG. 2, but comprises at least one, more preferably at least two and most preferably all of the layers mentioned below.

The device is preferably applied to a support material, in particular glass or another solid or flexible transparent material. An anode, for example an indium tin oxide (ITO) anode, is applied to the support material. The layer thickness of the anode is preferably 10 nm to 100 nm, in particular 30 to 50 nm. A hole-transport layer (HTL), in particular comprising a water-soluble hole-conductor material, is applied to the anode and between the anode and the emitter layer. A hole-conductor material of this type is, for example, PEDOT/PSS (polyethylenedioxythiophene/polystyrenesulfonic acid). The layer thickness of the HTL layer is preferably 10 to 100 nm, in particular 40 to 60 nm.

Next, the emitter layer (EML), which comprises an emitter according to the invention, is applied. The material may be dissolved in a solvent, for example acetone, dichloromethane or acetonitrile. This may prevent dissolution of the underlying layer (for example PEDOT/PSS). The emitter material according to the invention comprises a metal complex coverage in a suitable concentration, which prevents or greatly restricts triplet-triplet annihilation. Concentrations between 3% and 12% are particularly suitable.

An electron-transport layer (ETL) is preferably applied to the emitter layer, in particular in a layer thickness of 10 to 80 nm, more preferably 30 to 50 nm. A suitable material for the electron-transport layer is, for example, $Alq_3$, which can be applied by vapour deposition.

Next, a thin interlayer, which reduces the electron-injection barrier and protects the ETL layer, is preferably applied. This layer preferably has a thickness between 0.5 and 2 nm, in particular between 0.5 and 1.0 nm, and preferably consists of CsF or LiF. This layer is generally applied by vapour deposition. For a further-simplified OLED structure, the ETL layer and/or the interlayer may optionally be omitted.

Finally, a conductive cathode layer is applied, in particular by vapour deposition. The cathode layer preferably consists of a metal, in particular Al, Ag or Mg/Ag (in particular in the ratio 10:1). The interlayer is preferably very thin, in particular 0.5 to 2 nm, more preferably 0.8 to 1.0 nm, thick. Voltages of 3 to 15 V are preferably applied to the device.

The entire structure of the light-emitting device is preferably encapsulated using a suitable material in order substantially to prevent the ingress of water or oxygen.

EXAMPLES

1. Preparation of Phenylpyridine-Platinum(II) Complexes a) Anionic Complex:

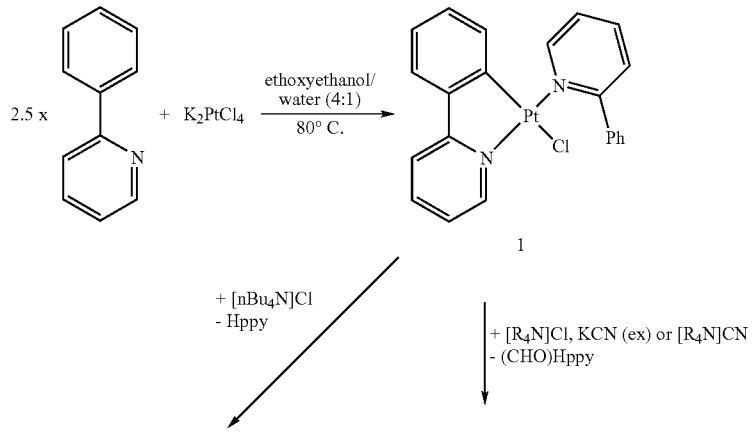

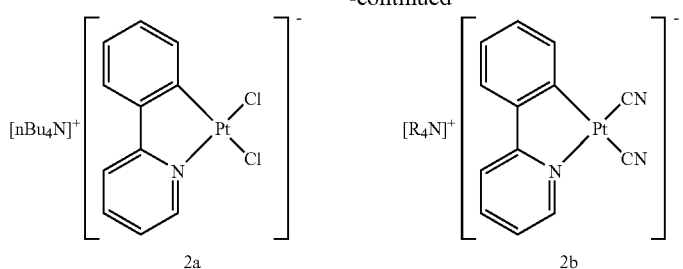

In a first step, K$_2$PtCl$_4$ is reacted with 2.5 equivalents of 2-phenylpyridine (Hppy) at 80° C. in a mixture of ethoxyethanol/water in the ratio 4:1, giving compound 1. In the next step, reaction with a polymeric ammonium salt [R$_4$N]Cl with simultaneous metathesis using an excess of KCN or reaction with [R$_4$N]CN gives the corresponding complex 2b. For purification of complex 2b, use is made of solvents which, on the one hand, are able to dissolve the KCN and the Hppy formed and do not dissolve the polymer (or vice versa). The cyanide-containing polymer is prepared by reaction with a large excess of cyanide salt. Compound 2a is prepared by reaction with the ammonium salt [nBu$_4$N]Cl.

b) Cationic Complex:

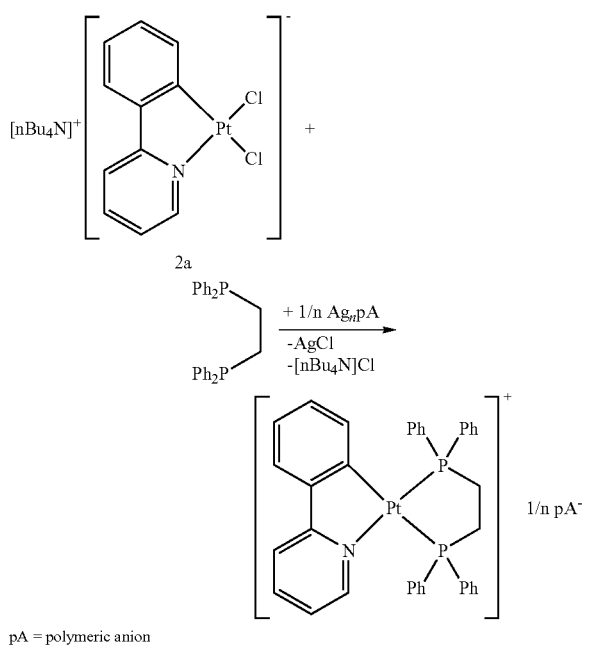

pA = polymeric anion

The reaction of compound 2a with neutral ligands gives a cationic complex.

[Pt(ppy)Cl$_2$]$^-$-Containing Polyammonium a) Synthesis

An aqueous solution of poly(diallyldimethylammonium chloride) ([PAA]Cl) was stirred with in the desired ratio n:m with addition of acetone until the yellow starting complex had dissolved. The solvent was removed in a rotary evaporator. The yellow polymer remaining was washed with dichloromethane in order to remove the 2-phenylpyridine formed. All polymers exhibit intense luminescence on irradiation with UV light. The polymers having a lower content of platinum exhibit better film-formation ability.

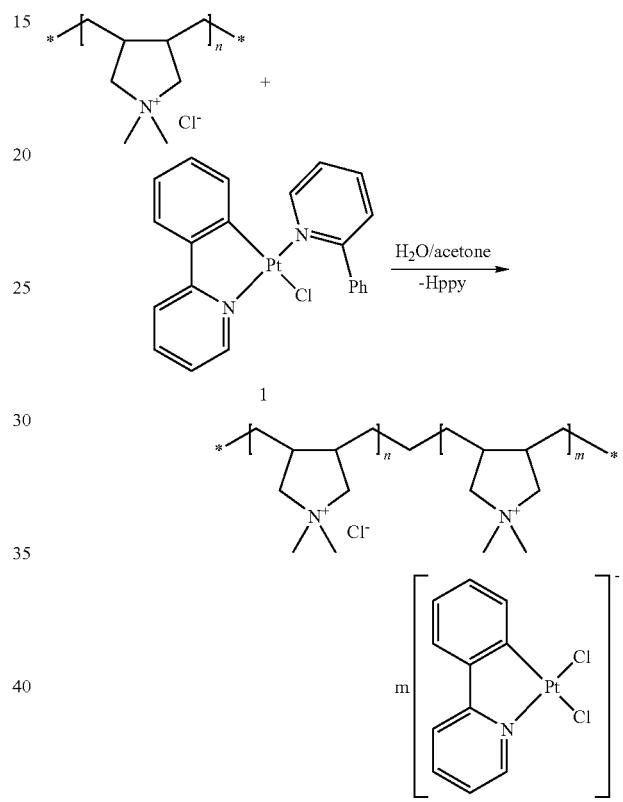

b) Spectroscopic Characterisation

Films of the polymers prepared were investigated by emission spectroscopy at room temperature. The films were produced by spin-coating their solutions in acetone. As confirmation that the emitting component is the anion [(ppy)PtCl$_2$]$^-$, a PMMA (PMMA=polymethyl methacrylate) film doped with the complex [N(nBu)$_4$][(ppy)PtCl$_2$], 2a, was imaged as comparison. The emission spectra of the polymer films of different degrees of coverage are shown in FIG. 3.

3. [Ru(bpy)$_3$]$^{2+}$-Containing Polyacrylic Acid a) Synthesis

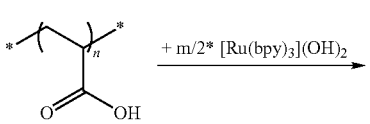

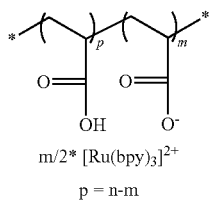

m/2* [Ru(bpy)₃]²⁺ p = n-m

In order to produce a polymer consisting of a polyanion and a cationic emitter, polyacrylic acid (PA) and the complex [Ru(bpy)₃]Cl₂ were selected. In a first step, the compound [Ru(bpy)₃](OH)₂×2H₂O was prepared as precursor by shaking an aqueous solution of [Ru(bpy)₃]Cl₂ with an aqueous suspension of Ag₂O in excess in a separating funnel. The excess Ag₂O was filtered off together with the AgCl formed, and the solvent was removed from the filtrate in vacuo. In order to obtain the desired coverage, the basic complex and the acidic polymer were weighed out in the corresponding ratios and stirred in water at room temperature for 12 h.

b) Spectroscopic Characterisation

Figure 4:
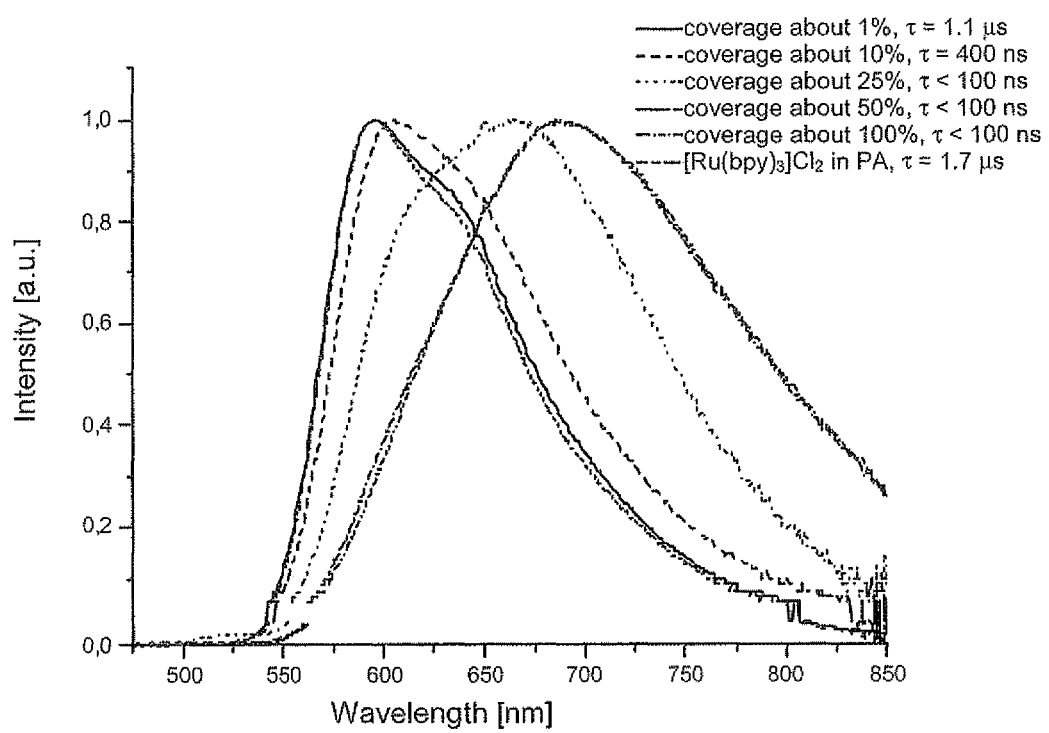
FIG. 4: Emission spectra of the polymers from Example 3 with different degrees of coverage. In addition, the emission of polyacrylic acid doped with $[Ru(bpy)_3]Cl_2$ is shown as reference.

In order to record changes in photophysical properties, such as emission colour and emission lifetime of the complex compound in the polymer, thin films of the polymer compounds were produced. To this end, the polymeric compounds were applied to a glass substrate by spin coating from a methanol solution. The reference used was a film of the neutral polymer polyacrylic acid doped with [Ru(bpy)₃]Cl₂, which was prepared in the same way. The emission spectra of the polymer films having different degrees of coverage are shown in FIG. 4.

With an increase in the degree of coverage, the emission lifetime of the complex thus shortens and the emission becomes shifted more towards red. A degree of coverage of about 4% is particularly suitable for use in OLED emitter layers.

The invention claimed is:

1. A light-emitting device comprising
   (i) an anode,
   (ii) a cathode and
   (iii) an emitter layer which is arranged between and in direct or indirect contact with the anode and the cathode and which comprises at least one charged emitter and an oppositely charged polymeric matrix, which interact with one another through electrostatic forces and wherein the emitter comprises a phosphorescent metal complex, clusters, metal-complex aggregates and/or fluorescent organic molecules
wherein the emitter is selected from metal complexes of the formula formula (I) or (II)

in which:
   M is a metal ion selected from the group consisting of Mo, Ru, Rh, Pd, Ag, W, Re, Os, Ir, Pt, Cu, Au and lanthanoids;
   $L_{CH}$ is in each case independently a bidentate or polydentate chelate ligand;
   L is in each case independently a monodentate ligand;
   x is an integer from 1 to 3;
   y is an integer from 1 to 4; and
   n is an integer from 1 to 4 and
   is capable of having 3 to 15 volts applied to the device.

2. The light-emitting device according to claim 1, wherein the emitter layer comprises 2 or more different charged emitters.

3. The light-emitting device according to claim 1, wherein the emitter layer comprises both anionic and cationic emitters, each of which are bonded to an oppositely charged polymeric matrix.

4. The light-emitting device according to claim 1, wherein the charges present in the polymeric matrix are localised on side chains or in the main polymer chain.

5. The light-emitting device according to claim 1, wherein oppositely charged emitters are coordinated to essentially all charges present in the polymeric matrix.

6. The light-emitting device according to claim 1, wherein, in addition to the matrix and emitter, the emitter layer essentially comprises no ionic constituents.

7. The light-emitting device according to claim 1, wherein, in addition to the matrix and emitter, the emitter layer essentially comprises no small, readily mobile ions.

8. The light-emitting device according to claim 1, wherein the charges present in the polymeric matrix are only partially compensated by oppositely charged emitter molecules and/or emitter complexes.

9. The light-emitting device according to claim 1, wherein the polymeric matrix is obtained by polymerisation, polycondensation, polyaddition and/or coupling reactions, in particular Heck or Suzuki coupling.

10. The light-emitting device according to claim 1, wherein the polymeric matrix comprises a polymer composed of at least 2 different monomeric units.

11. The light-emitting device according to claim 10, wherein the polymeric matrix is composed of charged and uncharged units.

12. The light-emitting device according to claim 1, wherein the emitter comprises an anionic metal complex and/or an anionic organic molecule, and the matrix comprises a cationic polymer.

13. The light-emitting device according to claim 1, wherein the emitter is organic, anionic, fluorescent molecules selected from the group consisting of coumarin, rhodamine, fluorescein, quinoline, pyrene, cyanine, triarylmethane, diarylmethane, azo dye, polyene, polymethine, carbonyl dye, porphyrin, covin, phthalocyanine, xanthene, anthraquinone and borate.

14. The light-emitting device according to claim 1, wherein the emitter comprises a cationic metal complex and/or a cationic organic molecule, and the matrix comprises an anionic polymer.

15. The light-emitting device according to claim 1, wherein the emitter is organic, cationic, fluorescent molecules selected from the group consisting of coumarin, rhodamine, fluorescein, quinoline, pyrene, cyanine, triarylmethane, diarylmethane, azo dye, polyene, polymethine, carbonyl dye, porphyrin, corrin, phthalocyanine, xanthene, anthraquinone and borate.

16. The light-emitting device according to claim 1, wherein the emitter is a lanthanoid cryptate.

17. The light-emitting device according to claim 1, wherein at least one charged emitter is bonded to a side chain of a polymer by a covalent bond and/or is a constituent of a main polymer chain.

18. The light-emitting device according to claim 17, wherein the bonding to a polymer takes place via at least one ligand of the emitter-metal complex.

19. The light-emitting device according to claim 17, wherein one or more emitters are bonded to side chains of the polymer.

20. The light-emitting device according to claim 17, wherein one or more emitters are a constituent of the main polymer chain.

21. The light-emitting device according to claim 17, wherein the polymer is uncharged.

22. The light-emitting device according to claim 17, wherein the polymer is the oppositely charged polymeric matrix.

23. The light-emitting device according to claim 1, wherein the cationic polymeric matrix comprises an organic nitrogen compound in which either at least one or all of the N atoms present are quaternized.

24. The light-emitting device according to claim 22, wherein the cationic polymeric matrix comprises units selected from:

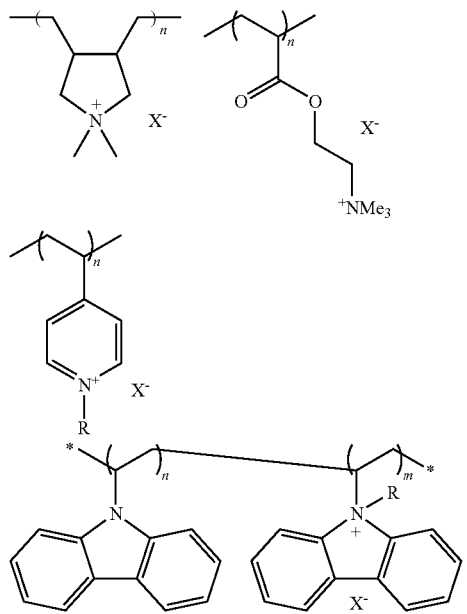

in which R represents an alkyl radical and X— represents an anion.

25. The light-emitting device according to claim 24, wherein R is a $C_1$-$C_6$-alkyl radical.

26. The light-emitting device according to claim 1, wherein the anionic polymeric matrix contains negatively charged groups selected from the group comprising tetraorganylborates and deprotonated acid groups.

27. The light-emitting device according to claim 1, wherein the proportion of emitter complexes in the emitter layer is from 1 to 100% by weight, based on the total weight of the emitter layer.

28. The light-emitting device according to claim 27, wherein the proportion of emitter complexes is greater than 80% by weight, based on the total weight of the emitter layer.

29. The light-emitting device according to claim 27, wherein the proportion of emitter complexes in the emitter layer is greater than 10% by weight, and up to 80% by weight, based on the total weight of the emitter layer.

30. The light-emitting device according to claim 27, wherein the proportion of emitter complexes in the emitter layer is greater than 20% by weight, and up to 70% by weight, based on the total weight of the emitter layer.

31. The light-emitting device according to claim 27, wherein the proportion of emitter complexes in the emitter layer is greater than 2% by weight, and up to 10% by weight, based on the total weight of the emitter layer.

32. The light-emitting device according to claim 27, wherein the proportion of emitter complexes in the emitter layer is greater than 4% by weight, and up to 8% by weight, based on the total weight of the emitter layer.

33. The light-emitting device according to claim 1, wherein the polymeric matrix has hole-conductor and/or electron-conductor properties.

34. The light-emitting device according to claim 1, wherein the device further comprises a hole-conductor layer and/or an electron-conductor layer.

35. The light-emitting device according to claim 34, wherein the hole-conductor layer comprises a polymeric aromatic nitrogen compound comprising polyvinylcarbazole.

36. The light-emitting device according to claim 1, wherein the device further comprises a CsF or LiF interlayer.

37. The light-emitting device according to claim 1, wherein the device is arranged on a substrate.

38. The light-emitting device according to claim 1, wherein device is a display and/or an illumination device.

39. Process for the production of the light-emitting device according to claim 1,
which comprises introducing at least one charged complex in the emitter layer by wet-chemical methods.

* * * * *